(12) United States Patent
Fukuoka et al.

(10) Patent No.: US 7,871,265 B2
(45) Date of Patent: Jan. 18, 2011

(54) HEAT TREATMENT DEVICE

(75) Inventors: Tetsuo Fukuoka, Koshi (JP); Takahiro Kitano, Koshi (JP); Kazuo Terada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 528 days.

(21) Appl. No.: 11/987,795

(22) Filed: Dec. 4, 2007

(65) Prior Publication Data
US 2008/0135207 A1 Jun. 12, 2008

(30) Foreign Application Priority Data
Dec. 8, 2006 (JP) ............................. 2006-331286

(51) Int. Cl.
*F27D 15/02* (2006.01)
(52) U.S. Cl. ...................... 432/81; 432/249; 219/443.1
(58) Field of Classification Search ................. 432/77, 432/81, 122, 123, 247, 249; 219/443.1, 444.1
See application file for complete search history.

(56) References Cited

U.S. PATENT DOCUMENTS

| | | | | |
|---|---|---|---|---|
| 6,354,832 | B1 * | 3/2002 | Yoshimura et al. | 432/247 |
| 6,474,986 | B2 * | 11/2002 | Oda et al. | 432/247 |
| 6,875,466 | B2 * | 4/2005 | Matsui et al. | 427/240 |
| 7,418,970 | B2 * | 9/2008 | Sugimoto et al. | 134/105 |
| 7,628,612 | B2 * | 12/2009 | Otsuka et al. | 432/247 |
| 7,645,136 | B2 * | 1/2010 | Arai et al. | 432/122 |
| 2007/0048979 | A1 | 3/2007 | Fukuoka et al. | |
| 2007/0160947 | A1 * | 7/2007 | Akimoto et al. | 432/77 |

FOREIGN PATENT DOCUMENTS

| | | |
|---|---|---|
| JP | 11-214486 | 8/1999 |
| JP | 2003-037033 | 2/2003 |
| JP | 2006-210400 | 8/2006 |

* cited by examiner

*Primary Examiner*—Gregory A Wilson
(74) *Attorney, Agent, or Firm*—Smith, Gambrell & Russell, LLP

(57) ABSTRACT

In a heat treatment device including a heating chamber having a heating plate heating a semiconductor wafer, a cooling plate cooling the wafer heated by the heating chamber, and a transporting device transporting the wafer into and from the heating chamber, the cooling plate is provided with a coolant passage, a plurality of projections carrying the wafer with a space between the wafer and the surface of the cooling plate, and suction holes neighboring to the respective projections and connected to a suction device.

18 Claims, 16 Drawing Sheets

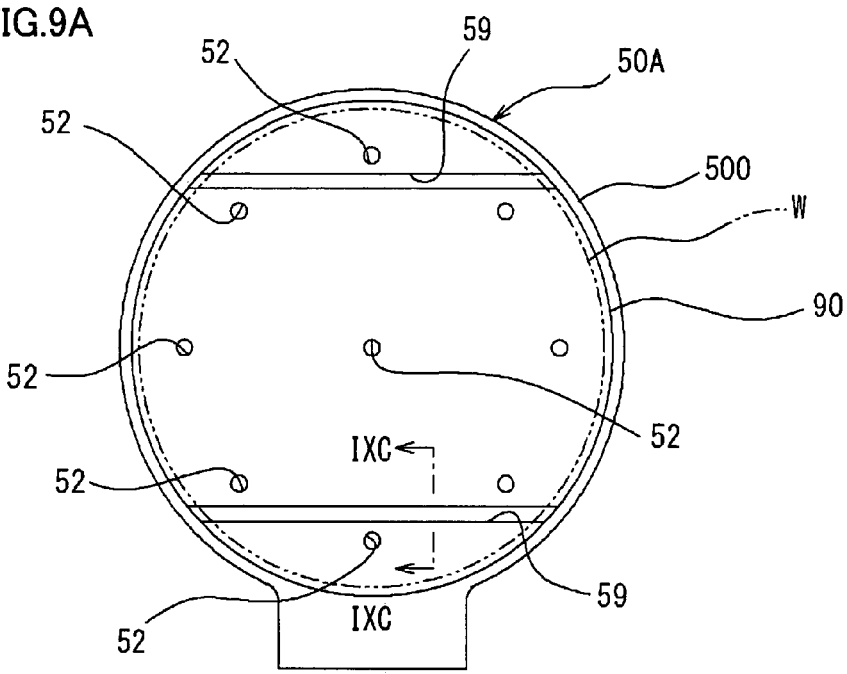
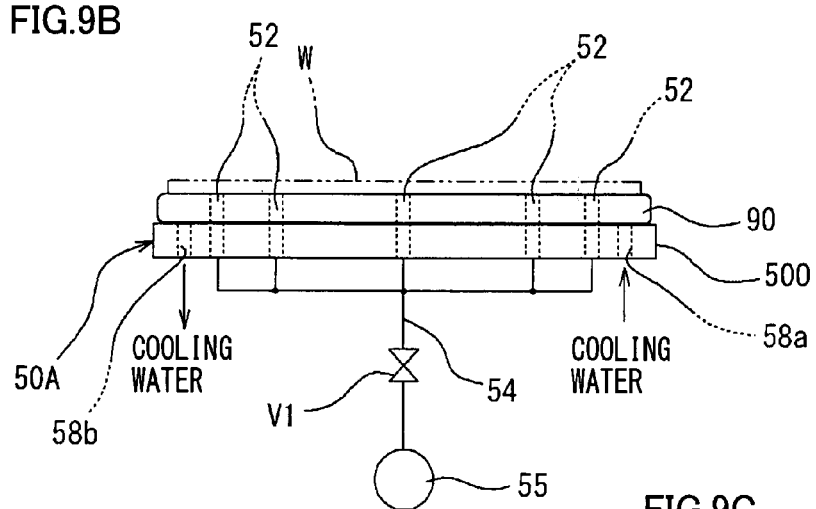
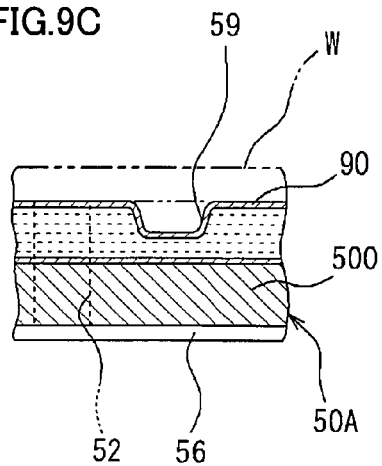

HEAT TREATMENT DEVICE

BACKGROUND OF THE INVENTION

1. Field of the Invention

The invention relates to a heat treatment device, and particularly to a heat treatment device performing heat treatment on a work substrate (i.e., a substrate to be treated) such as a semiconductor wafer or an LCD substrate.

2. Description of the Background Art

In a conventional photoresist step, which is one of semiconductor manufacturing steps, resist is applied over a surface of a semiconductor wafer or a substrate of an LCD substrate or the like (which will be referred to as a "wafer" hereinafter), and is exposed with a predetermined pattern. Then, a developer liquid is supplied onto the surface of the wafer, and development is performed to form a resist pattern. For protecting the resist, a step of applying a protective film over the surface of a resist layer is generally incorporated into the above photoresist step.

In recent years, it has been increasingly requested to increase an exposure resolution according to miniaturization of device patterns and reduction in thickness thereof. For increasing the exposure resolution, a method in which an anti-reflective coating (s) are arranged under and/or above a resist has been employed. A technology has also been known as another method for the miniaturization. In this technology, a photoresist pattern is formed by performing exposure multiple times on a photoresist on a substrate with a predetermined mask patterns, and then the photoresist pattern is miniaturized using plasma ashing or the like.

In the above miniaturizing technology, a multi-layer film is formed over the surface of the wafer, and further the multiple applying operations and the subsequent heat treatment are repeated. Therefore, the wafer may warp due to stacking of different kinds of films and changes in temperature and the like. For example, when a chemically amplified resist is used and the wafer warps during cooling performed after the heat treatment subsequent to the exposure, variations occur in state of temperature lowering to a temperature (e.g., 50 degrees C.) at which an acid catalytic reaction on the wafer surface stops, and a line width cannot be kept uniform.

A device for suppressing a warp of a wafer has been known (e.g., Japanese Patent Laying-Open No. 2006-210400). This device has a measuring unit for measuring a warp, a plurality of blow/suction holes selectively blowing and drawing a gas, and a control unit performing the blowing or drawing by each blow/suction holes according to a measurement result provided by the warp measuring unit.

In another known device (e.g., Japanese Patent Laying-Open No. 11-214486), a plurality of projections are arranged on a top surface of a stage carrying a wafer, or a seal ring is arranged for contact with a peripheral portion of the wafer in addition to arrangement of the plurality of projections, and an air is drawn out from a space between the wafer and the stage to keep a uniform space between the wafer and the stage.

However, the technology disclosed in Japanese Patent Laying-Open No. 2006-210400 is configured to control the blowing or drawing by the blow/suction holes according to the measurement result of the warp measuring unit that measures the warp. Therefore, the structure is complicated, and further a time for suppressing the warp is required so that it is difficult to perform the cooling processing within a short time after the heat treatment.

According to the technology disclosed in Japanese Patent Laying-Open No. 11-214486, the structure can be simpler than that in Japanese Patent Laying-Open No. 2006-210400, but is configured to press the wafer onto the projections by keeping a negative pressure in a space between the stage and the wafer laid on the plurality of projections arranged on the top surface of the stage. Therefore, a negative pressure must be kept in whole the space between the wafer and the stage, and a large negative pressure is required for such a state. Also, when the wafer warps into a complicated form, it is difficult to press reliably the wafer onto the projections, and it may be impossible to suppress reliably the warp of the wafer.

SUMMARY OF THE INVENTION

An object of the invention is to provide a heat treatment device that suppresses a warp of a work substrate and performs uniform cooling processing.

According to an aspect of the invention, a heat treatment device includes a heating chamber having a heating plate heating a work substrate, a cooling plate cooling the work substrate heated by the heating plate, and a transporting device transporting the work substrate into and from the heating chamber. The cooling plate includes a coolant passage, a plurality of projections defining a space between the work substrate laid on the cooling plate and a body surface of the cooling plate, and suction holes arranged near the respective projections and communicated with a suction device.

Preferably, in the above heat treatment device, the transporting device includes a plurality of wires extending across a transport passage connecting the heating chamber to the cooling plate, and transporting the work substrate laid on the wires, and a wire moving mechanism moving the wires to transport the work substrate between a position above the cooling plate and a position in the heating chamber. The cooling plate includes a groove formed at the surface of the cooling plate and allowing the wires to move into the groove, and a raising mechanism for raising and lowering the cooling plate relatively to the wires for transferring the work substrate to and from the wires.

Preferably, in the heat treatment device described above, the cooling plate includes a suction groove formed on a rear surface side of the cooling plate for connecting the suction holes together, and a closing member closes an opening of the suction groove.

Preferably, in the heat treatment device described above, the cooling plate includes a suction groove formed on a rear surface side of the cooling plate for connecting the suction holes together, and an accommodation space formed in the suction groove located at a crossing position of the suction hole and the coolant passage for accommodating a pipe forming the coolant passage. A closing member closes openings of the suction groove and the accommodation space.

Preferably, in the heat treatment device described above, the cooling plate includes a plate moving mechanism moving the cooling plate toward and away from the heating chamber for operating the cooling plate also as the transporting device, and an open groove for inserting a vertically movable support pin transferring the work substrate with respect to the cooling plate.

According to another aspect of the invention, a heat treatment device includes a heating chamber having a heating plate heating a work substrate, a cooling plate cooling the work substrate heated by the heating plate, and a transporting device transporting the work substrate into and from the heating chamber. The cooling plate includes a coolant passage formed of a flexible coolant-containing bag layered over a body surface of the cooling plate, and a plurality of suction holes communicated with a suction device.

According to still another aspect of the invention, a heat treatment device includes a heating chamber having a heating plate heating a work substrate, a cooling plate cooling the work substrate heated by the heating plate, and a transporting device transporting the work substrate into and from the heating chamber. The cooling plate includes a coolant passage formed of a flexible coolant-containing bag layered over a body surface of the cooling plate, a plurality of projections defining a space between the work substrate laid on the coolant-containing bag and a surface of the coolant-containing bag, and suction holes arranged near the respective projections and communicated with a suction device.

Preferably, in the heat treatment device described above, the transporting device includes a plurality of wires extending across a transport passage connecting the heating chamber to the cooling plate, and transporting the work substrate laid on the wires, and a wire moving mechanism moving the wires to transport the work substrate between a position above the cooling plate and a position in the heating chamber. The cooling plate includes a groove formed at the surface of the coolant-containing bag and allowing the wires to move into the groove, and a raising mechanism for raising and lowering the cooling plate relatively to the wires for transferring the work substrate.

Preferably, in the heat treatment device described above, the coolant-containing bag is formed of a plurality of divided bags communicated with each other via a communication passage.

Preferably, in the above heat treatment device, the cooling plate includes a plate moving mechanism moving the cooling plate toward and away from the heating chamber for operating the cooling plate also as the transporting device, and an open groove for inserting a vertically movable support pin transferring the work substrate to and from the cooling plate.

Owing to the structures described above, the invention can achieve outstanding effects as described below.

(1) According to the invention, the suction is applied from the suction holes near the respective projections to the work substrate laid on the projections of the cooling plate, and thereby the work substrate can be reliably pressed onto each projection to keep the uniform space between the work substrate and the cooling plate. Therefore, the warp of the work substrate can be reliably suppressed, and the cooling processing can be uniformly performed so that the heat treatment can be efficiently performed.

(2) According to the invention, the suction is applied from each suction hole to the work substrate laid on the coolant-containing bag of the cooling plate, and thereby the work substrate can be reliably pressed onto the surface of the coolant-containing bag that is deformable. Therefore, the warp of the work substrate can be reliably suppressed, and the cooling processing can be performed uniformly so that the heat treatment can be efficiently performed. When the coolant-containing bag is provided at its surface with a plurality of the projections for carrying the work substrate with a space kept with respect to the surface of the coolant-containing bag, the uniform space can be kept between the work substrate and the cooling plate surface, and the contact of the whole surface of the work substrate with the coolant-containing bag can be prevented so that smearing of the work substrate can be prevented.

(3) According to the invention, the wires, can transfer the work substrate into and from the heating chamber. Also, it can be moved into the groove arranged at the coolant-containing bag of the cooling plate so that the work substrate on the wires can be transferred onto the coolant-containing bag of the cooling plate. By moving the wires upward from the groove, the work substrate on the coolant-containing bag can be transferred onto the wires. Therefore, in addition to the features in the above items (1) and (2), the transportation efficiency of the work substrate can be further improved, and adhesion of particles onto the work substrate can be suppressed.

(4) According to the invention, the cooling plate can have the function of the transporting device, and the work substrate can be cooled during the operation of transferring the work substrate away from the heating chamber. Therefore, in addition to the features in the above items (1) and (2), the efficiency of the cooling processing can be improved, and a throughput can be improved.

(5) According to the invention, the plurality of suction holes are communicated with each other so that all the suction holes can be connected to the same suction unit through the suction groove. Therefore, the negative pressure can be uniformly applied to the work substrate, and the warp of the work substrate can be reliably suppressed.

(6) According to the invention, it is possible to avoid the interference between the coolant passage and the suction groove communicated with the suction holes, and a coolant route and a suction route can be formed independently of each other in the cooling plate. Therefore, the cooling plate can be small in thickness, and the device can be small in size.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9A-9C are a schematic plan (FIG. 9A) of a cooling plate in a second embodiment of the heat treatment device according to the invention, a side view (FIG. 9B) thereof and an enlarged cross section (FIG. 9C) taken along line IXC-IXC in FIG. 9A.

DESCRIPTION OF THE PREFERRED EMBODIMENTS

Embodiments of the invention will now be described with reference to the drawings.

Figure 1:
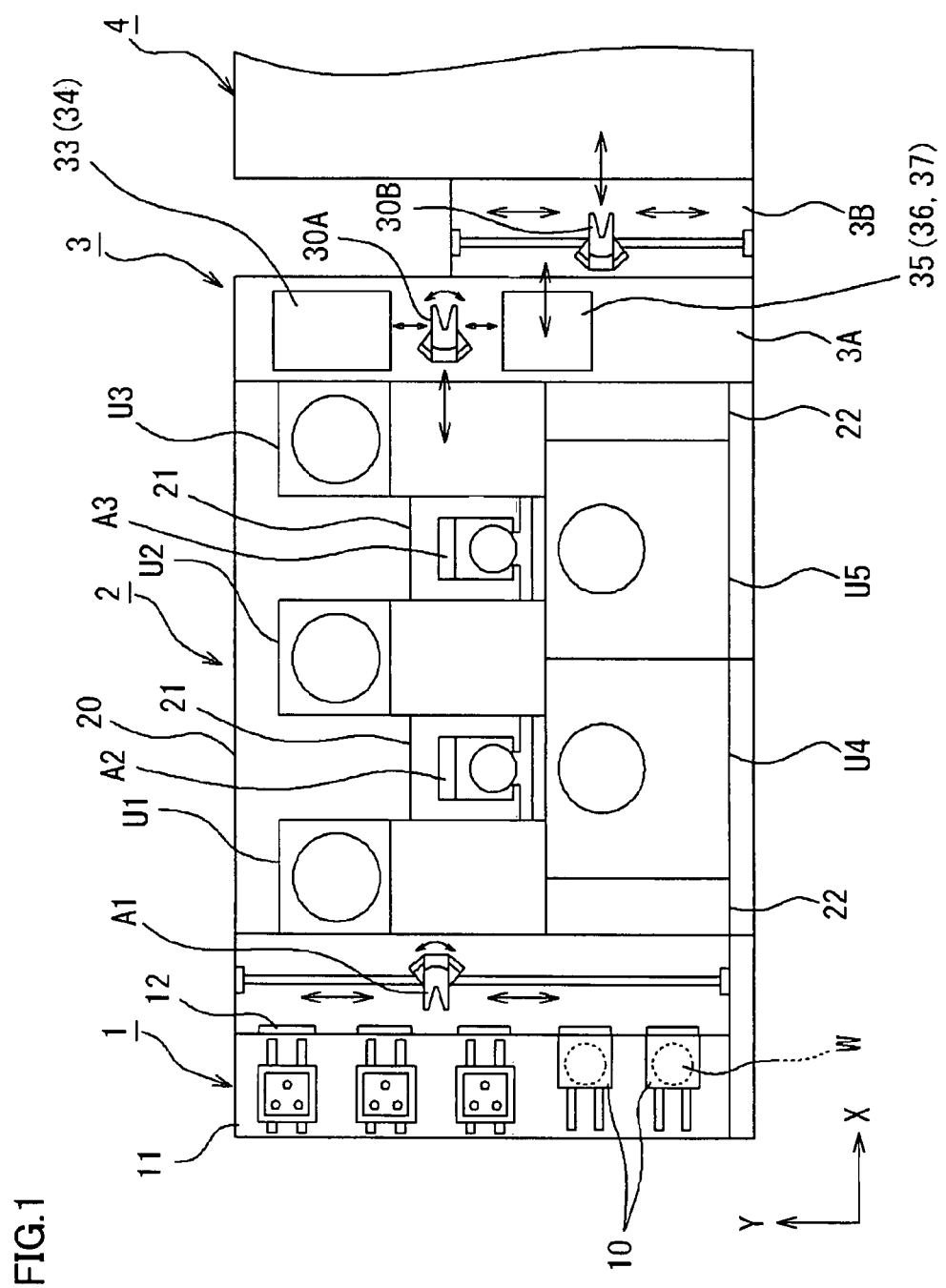
FIG. 1 is a schematic plan showing a whole application/development processing system employing a heat treatment device according to the invention.
Figure 2:
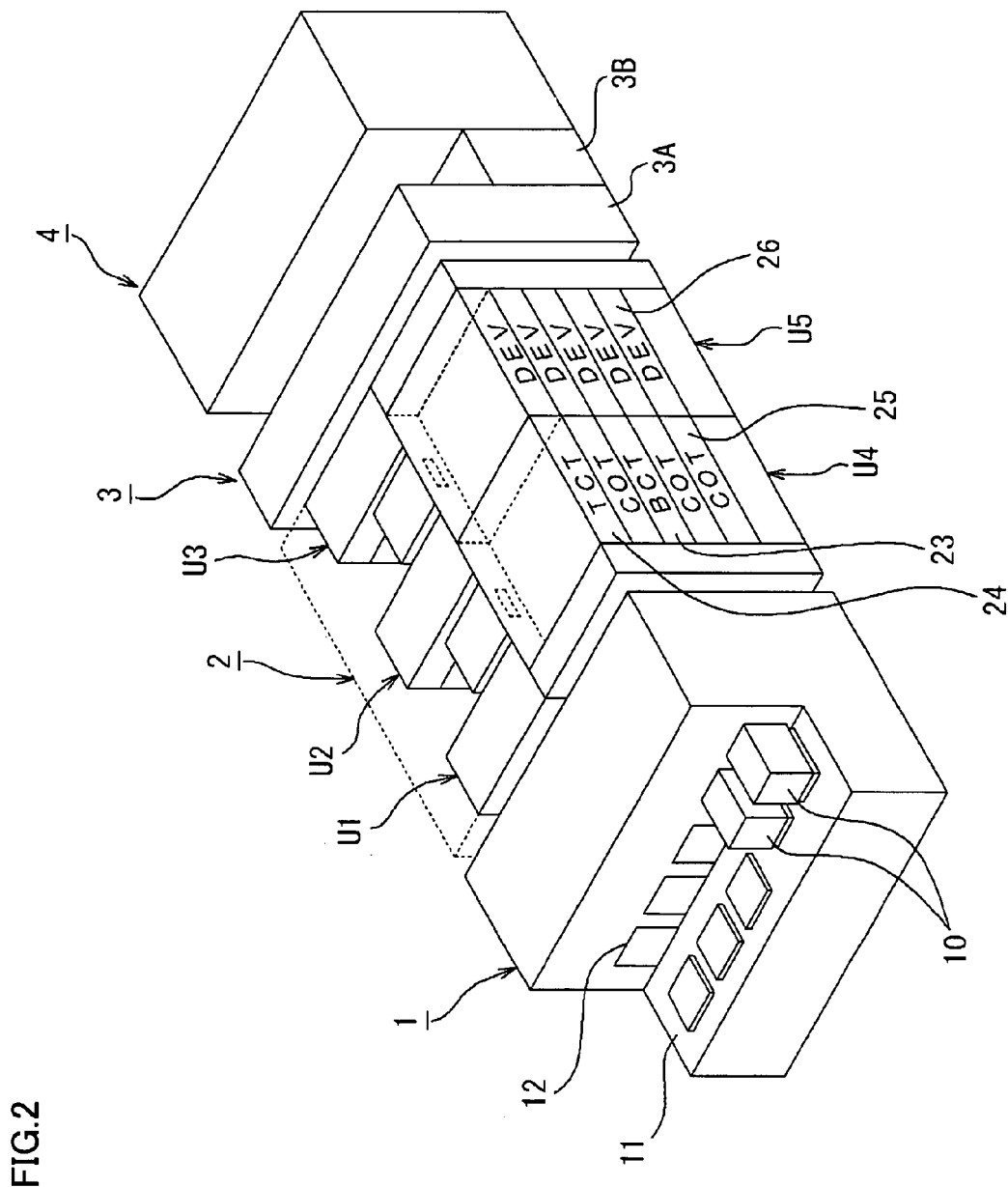
FIG. 2 is a schematic perspective view of the processing system.

FIG. 1 is a schematic plan showing a whole processing system in which an exposure processing device is connected to an application/development processing device employing a heat treatment device according to the invention. FIG. 2 is a schematic perspective view of the processing system.

The processing system includes a carrier station 1 for transporting carriers 10 each sealingly accommodating a plurality of (e.g., twenty-five) semiconductor wafers W which are work substrate s (i.e., substrates to be processed) and will be simply referred to as "wafers W" hereinafter, a processing unit 2 for performing processing such as resist application and development on wafer W taken out from carrier station 1, an exposing unit 4 performing immersion exposure on a surface of wafer W over which a translucent liquid layer is formed, and an interface unit 3 that is connected between processing unit 2 and exposing unit 4 for transferring wafer W.

Carrier station 1 is provided with a table 11 on which a plurality of carriers 10 can be placed, open/close units 12 formed at a front wall (i.e., a downstream wall with respect to table 11) and a transfer device A1 for taking out wafer W from carrier 10 through open/close unit 12.

Processing unit 2 is connected to the downstream side of carrier station 1 and is surrounded by a casing 20. In processing unit 2, there are arranged shelf units U1, U2 and U3 that are aligned in the longitudinal direction of processing unit 2 and each are formed of heating/cooling units in a stacked fashion. Main transporting devices A2 and A3 are arranged alternately to shelf units U1, U2 and U3 for transferring wafers W to and from shelf units U1, U2 and U3 as well as liquid processing units U4 and U5 to be described later. Each of main transporting devices A2 and A3 is arranged in a space surrounded by a partition 21 formed of longitudinally front and rear walls (i.e., walls at the upstream and downstream positions when viewed in the longitudinal direction, i.e., X-direction) of neighboring shelf units U1 and U2 (or U2 and U3) as well as, e.g., a wall of liquid processing unit U4 or U5 on the right side (when viewed longitudinally from carrier station 1) and a rear wall on the left side. Between carrier station 1 and processing unit 2 as well as between processing unit 2 and interface unit 3, there is arranged a temperature/humidity control unit 22 including a temperature control device for a processing liquid used in each unit, ducts for temperature/humidity control and the like.

Each of shelf units U1, U2 and U3 is formed of a plurality of (e.g., ten) various units stacked together for performing pre-processing or post-processing for the processing performed in liquid processing unit U4 or U5. The combination of such units includes a heating unit (HP) for baking wafer W, a cooling unit (CPL) for cooling wafer W and others.

Each of liquid processing units U4 and U5 is formed of a plurality of (e.g., five) units that are stacked together and arranged on containers of chemicals such as resist and liquid developer, and more specifically is formed of a bottom anti-reflective coating applying unit (BCT) 23, a top anti-reflective coating applying unit (TCT) 24, an coating unit (COT) 25 for applying anti-reflective coating and a developing unit (DEV) 26 that supplies the developer onto wafer W and performs the development. This application/development device includes a heat treatment device according to the invention which cleans wafer W coated with the resist before the exposure, and also cleans wafer W after the exposure. In this example, the heat treatment device is arranged in developing unit (DEV) 26.

Figure 3:
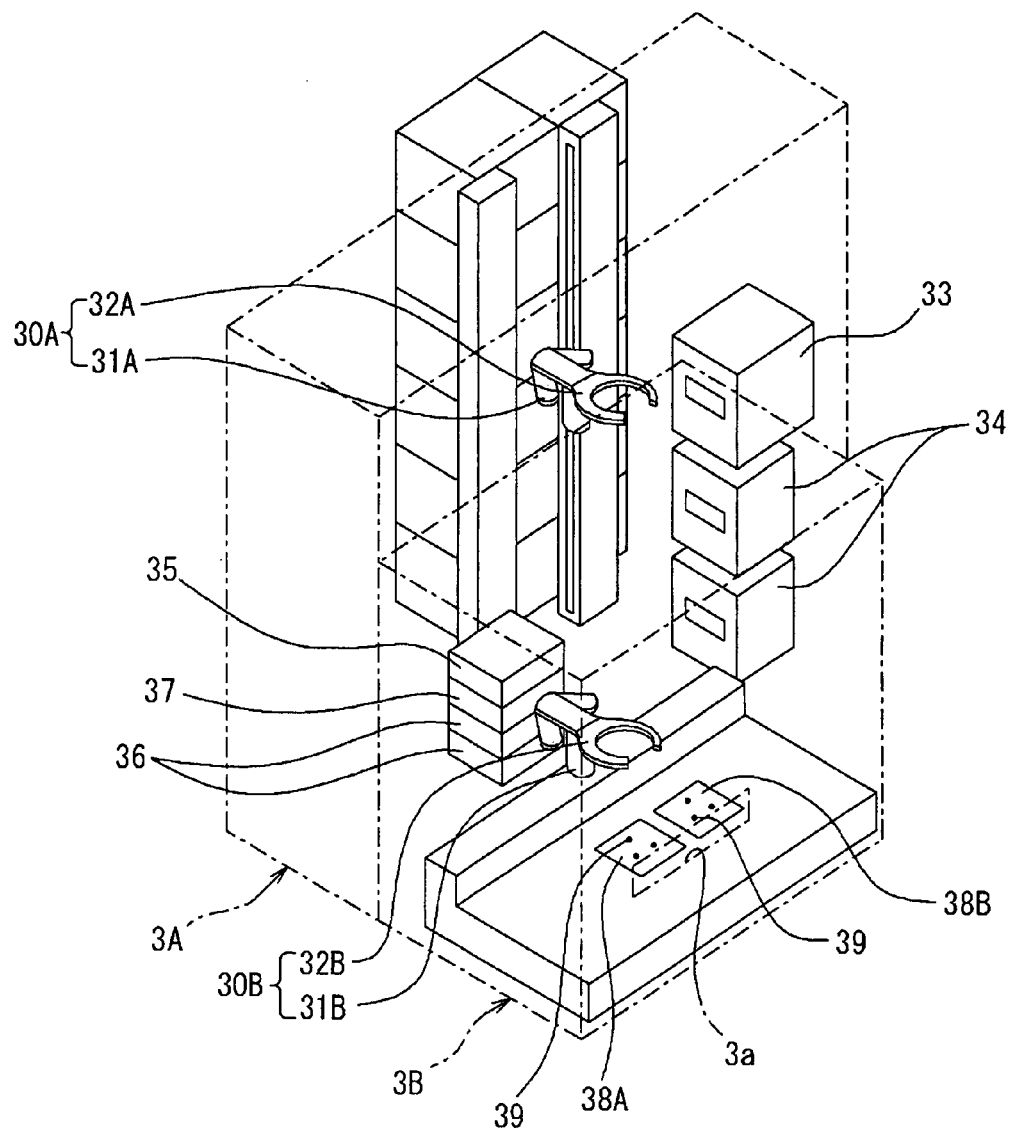
FIG. 3 is a perspective view showing an interface unit in the processing system.

As shown in FIG. 3, interface unit 3 is formed of first and second transport chambers 3A and 3B, which are arranged in the front and rear positions between processing unit 2 and exposing unit 4, and have first and second wafer transporting units 30A and 30B, respectively. First wafer transporting unit 30A is formed of a base 31A that is vertically movable and is turnable around a vertical axis, and a horizontally movable arm 32A arranged on base 31A. Second wafer transporting unit 30B is formed of a base 31B that is vertically movable and is turnable around a vertical axis, and a horizontally movable arm 32B arranged on base 31B.

First transport chamber 3A includes a periphery exposing device (WEE) 33 for selectively exposing only the edge of wafer W as well as two buffer cassettes 34 that are, e.g., stacked together for temporarily accommodating a plurality of (e.g., twenty-five) wafers W, and these device 33 and cassettes 34 are arranged on the left side with respect to first wafer transporting unit 30A when viewed longitudinally from carrier station 1 side. On the right side, there are arranged a transfer unit 35 as well as two high precision temperature control units 36 each having, e.g., a cooling plate, and a heating/cooling unit (PEB) 37 performing PEB processing on exposed wafer W. For example, these units 35, 36 and 37 are stacked together. A heat treatment device 40 according to the invention to be described later is arranged in heating/cooling unit (PEB) 37. Transfer stages 38A and 38B are arranged for transferring wafer W between second transport chamber 3B and exposing unit 4 through a wafer transport opening 3a formed on exposing unit 4 side, and are laterally aliened to each other. Each of transfer stages 38A and 38B is provided at its surface with, e.g., three substrate support pins 39 supporting the rear surface side of wafer W.

Heat treatment device 40 according to the invention will be described with reference to FIGS. 4-17D. Wafer W to be described below has a size, e.g., of 12 inches.

First Embodiment

Figure 4:
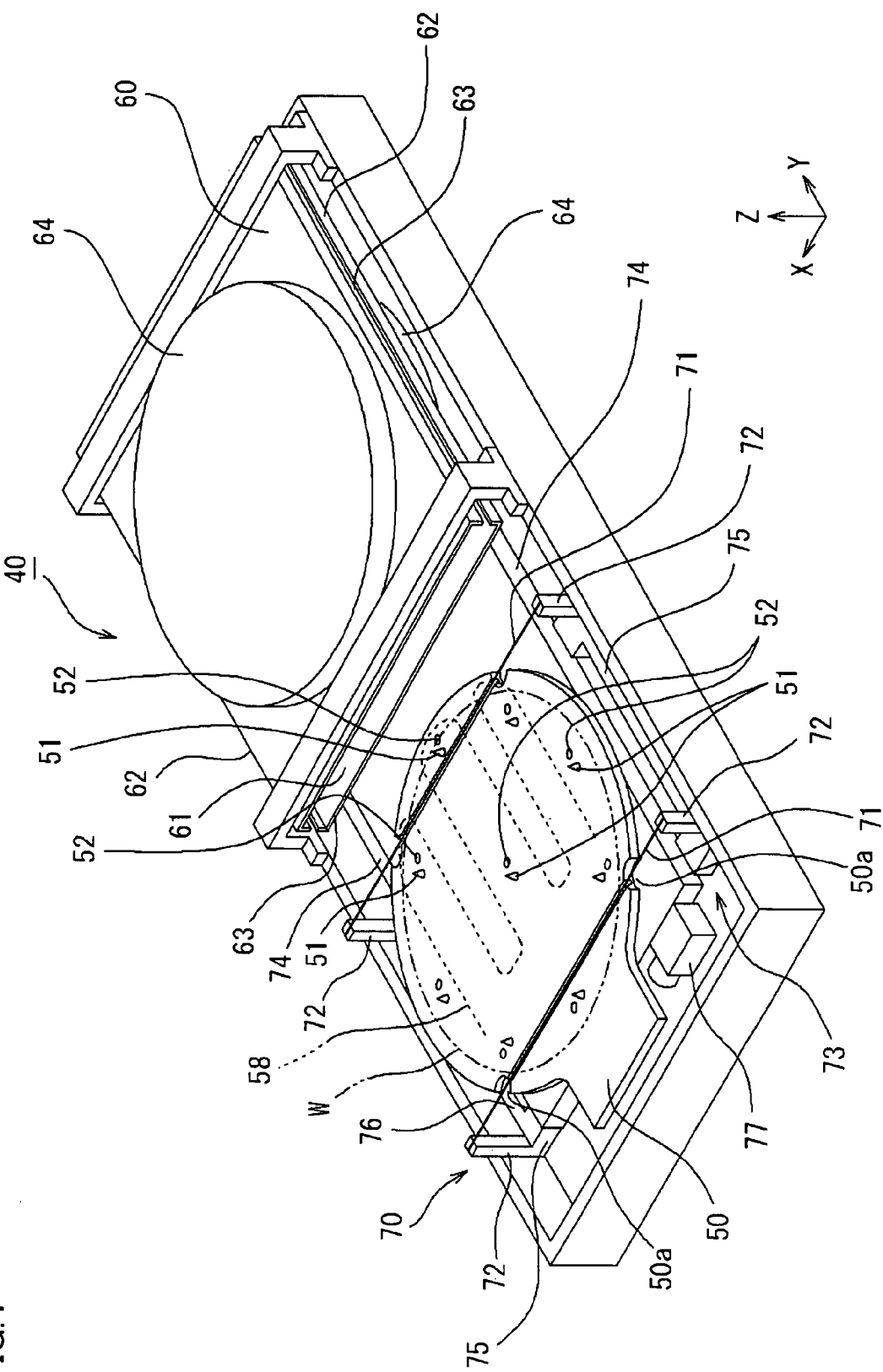
FIG. 4 is a schematically perspective view showing a first embodiment of the heat treatment device according to the invention.
Figure 5:
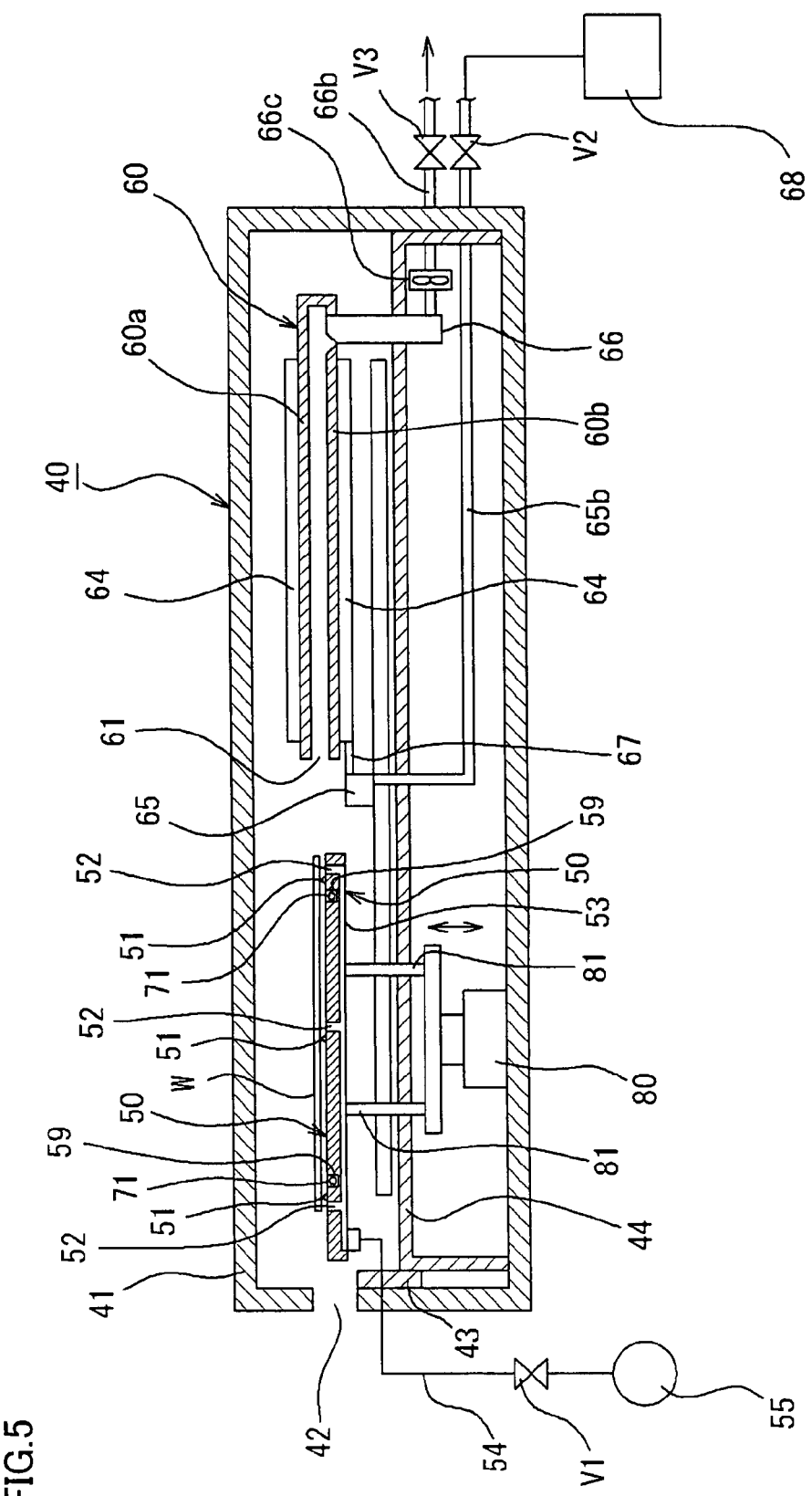
FIG. 5 is a schematic cross section of the heat treatment device of the first embodiment.
Figure 6:
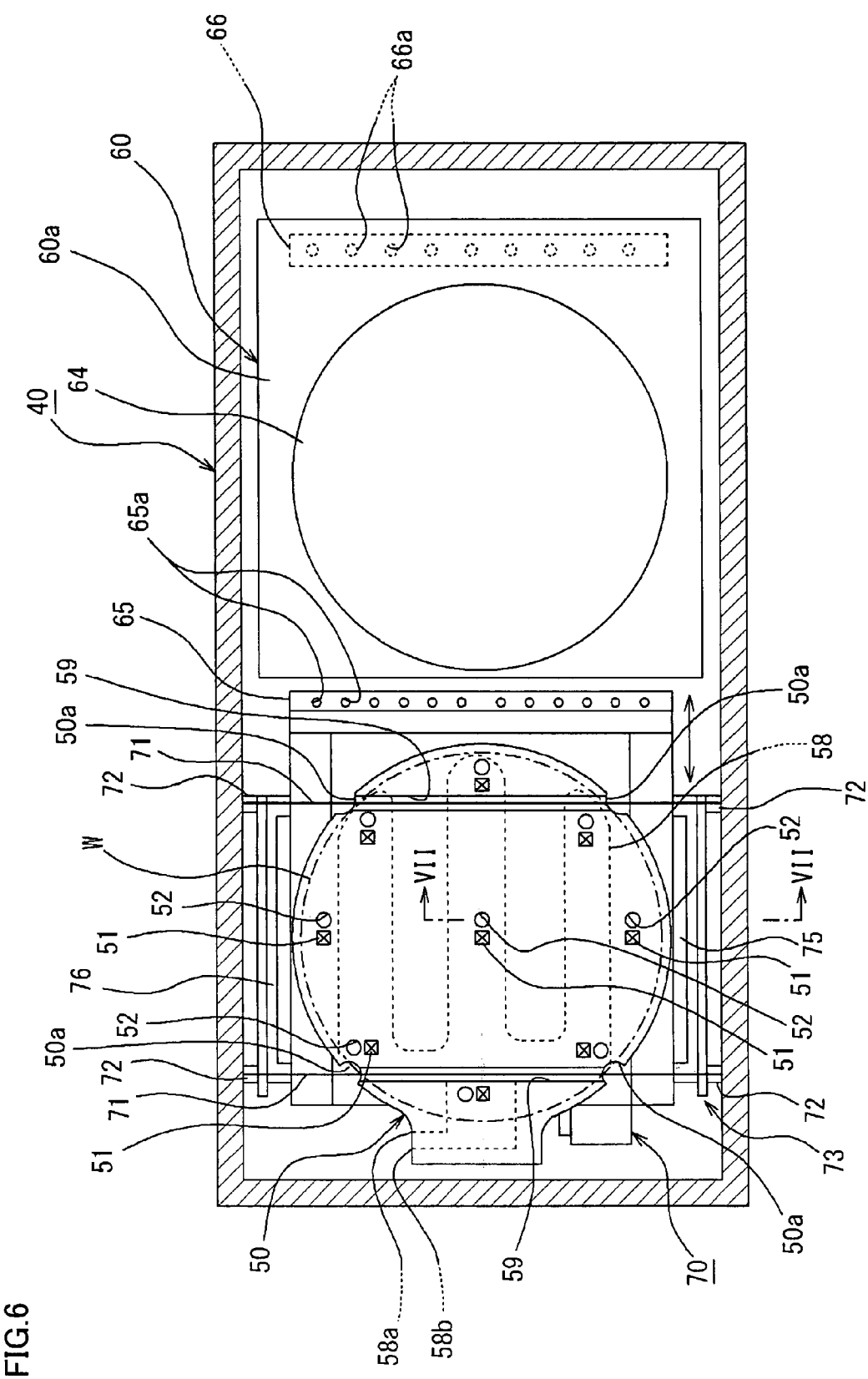
FIG. 6 is a schematic plan of the heat treatment device of the first embodiment.

FIG. 4 is a schematic perspective view showing a major portion of a first embodiment of heat treatment device 40 according to the invention. FIG. 5 is a schematic cross section of heat treatment device 40, and FIG. 6 is a schematic plan of heat treatment device 40.

As shown in FIG. 5, heat treatment device 40 includes a casing 41 forming a processing container, and a transport opening 42 is formed for wafer W at the side wall of casing 41. Transport opening 42 can be closed by a shutter 43. When wafer W is being heater, an external air may flow into casing 41 through transport opening 42, and thereby may disturb a gas flow formed around wafer W as described later. Therefore, shutter 43 is employed for preventing this situation. However, shutter 43 may be replaced with, e.g., an air curtain formed near transport opening 42 for preventing entry of an external air.

A base 44 is arranged under casing 41. On a front side of base 44, i.e., on a side near transport opening 42, a cooling plate 50 is arranged for cooling wafer W, and a flat heating chamber 60 is arranged on a rear side for performing heat treatment on wafer W. An opening 61 for transporting wafer W into and from heating chamber 60 is formed at a side wall of heating chamber 60 opposed to cooling plate 50. A transporting device 70 transports wafer W between a space above cooling plate 50 and an inner space of heating chamber 60, and the heat treatment is performed on wafer W in heating chamber 60 while holding wafer W by transporting device 70.

Figure 7:
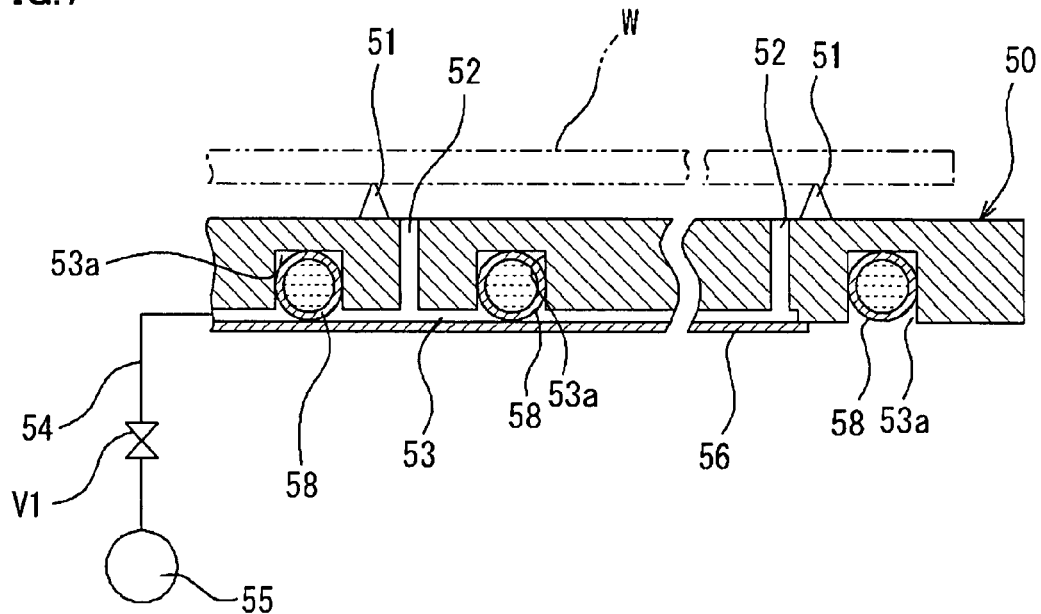
FIG. 7 is an enlarged cross section taken along line VII-VII in FIG. 6.

Cooling plate 50 is made of, e.g., an aluminum alloy, and is formed of a substantially circular plate member having substantially the same diameter as wafer W. For example, a region of cooling plate 50 other than a groove 59 to be described later has a thickness of about 4 mm. As shown in FIGS. 4 and 6, cooling plate 50 is provided at its surface with projections 51 for proximity that are located at a center of cooling plate 50 and a plurality of (e.g., eight) positions circumferentially equally spaced from each other on the same circle. Projections 51 are employed for placing wafer W thereon with a slight space, e.g., of about 0.1 mm kept with respect to the surface of cooling plate 50. Suction holes 52 are formed near projections 51, respectively. As shown in FIG. 7, suction holes 52 are communicated with each other through a suction groove 53 formed at the rear surface of cooling plate 50, and are connected to a suction device, i.e., a vacuum pump 55 through a suction conduit 54 connected to suction groove 53. A closing member 56 made of, e.g., stainless steel closes an opening of suction groove 53. An open/close valve V1 is arranged in suction conduit 54.

On cooling plate 50, a cooling water passage pipe 58, which is a coolant passage and will be simply referred to as a cooling pipe 58 hereinafter, is arranged in a substantially zigzag form for cooling uniformly a whole area of cooling plate 50 supporting wafer W. A cooling water inlet 58a is formed at an end of cooling pipe 58, and is connected to a cooling water source (not shown). An outlet 58b of the cooling water is formed at the other end. In this case, An accommodation space 53a accommodating cooling pipe 58 is formed on the rear surface side of cooling plate 50, and foregoing closing member 56 closes the opening of accommodation space 53a that has accommodated cooling pipe 58. Thereby, suction groove 53 and the opening of accommodation space 53a can be simultaneously closed.

Figure 8:
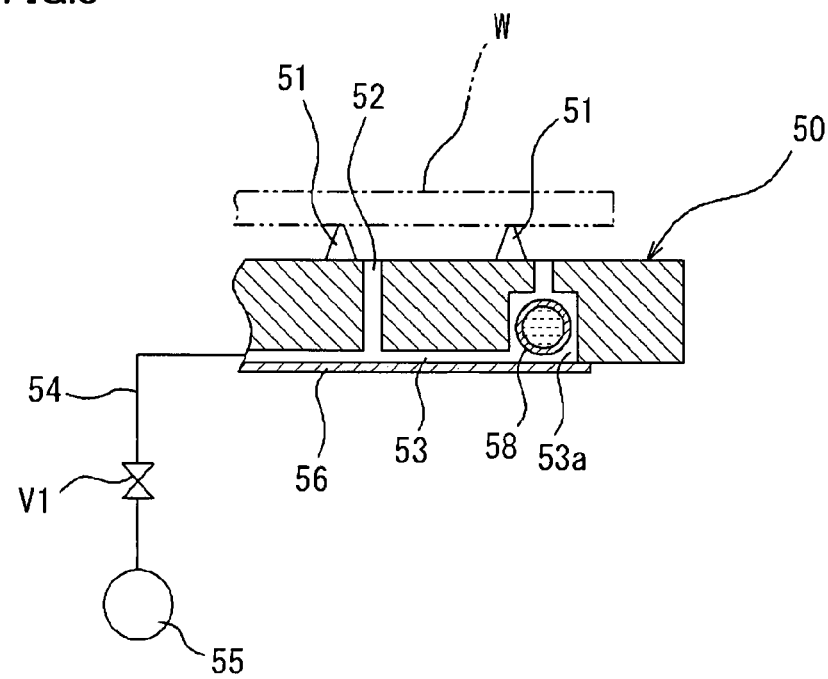
FIG. 8 is an enlarged cross section showing a major portion of a modification of a cooling plate in the heat treatment device of the first embodiment.

In the above structure, accommodation space 53a accommodating cooling pipe 58 may be formed at suction groove 53 in a position where suction hole 52 crosses cooling pipe 58, as shown in FIG. 8, and closing member 56 may close the common opening of suction groove 53 and accommodation space 53a. In this structure, a slight space is formed between accommodation space 53a and cooling pipe 58 so that suction can be applied through suction hole 52 communicated with accommodation space 53a. This structure can avoid interference between cooling pipe 58 and suction groove 53 communicated with suction hole 52, and allows provision of both the cooling system and the suction system inside cooling plate 50 without increasing the thickness of cooling plate 50.

As described above, cooling plate 50 is provided at its surface with nine projections 51 that are located at the center and circumferentially equally spaced eight positions on the same circle, respectively, and suction holes 52 are arranged near respective projections 51 and are connected to vacuum pump 55. Thereby, vacuum pump 55 applies the negative pressure to the portion near each projection 51 to draw and thus to press wafer W onto each projection 51 so that a space can be kept between wafer W and the surface of cooling plate 50. Therefore, the negative pressure can be uniformly applied to wafer W without requiring a large negative pressure, and the warp of wafer W can be suppressed. Also, the cooling water supplied into cooling pipe 58 can uniformly cool wafer W laid on cooling plate 50.

In the above description, projections 51 on cooling plate 50 are located at the center and circumferentially equally spaced eight positions on the same circle. However, projections 51 are not restricted in number provided that they are larger than two. For reliably suppressing complicated warp of wafer W, it is preferable that projections 51 are located at the center of cooling plate 50 and circumferentially equally spaced positions on one or more circle(s).

Transporting device 70 is provided with a plurality of (e.g., two) wires 71 that extend across a moving path of wafer W extending in the longitudinal direction (Y direction in FIGS. 4 and 6) of casing 41 for carrying and transporting wafer W. Wires 71 are made of a heat-resistant material that does not thermally deform even when wafer W undergoes heat treatment at 230 degrees C. to 250 degrees C., and are made of, e.g., synthetic fibers such as alamido fibers, and ceramic fibers such as silicon carbide fibers and carbon fibers. For example, each wire 71 has a diameter of about 0.5 mm.

Wire 71 has a length larger than diameters of wafer W and cooling plate 50, and the opposite ends thereof are carried by a pair of wire supports 72, respectively. Wire support 72 is moved by a moving mechanism 73 for transporting wafer W between a position above cooling plate 50 and a position inside heating chamber 60. It is assumed that a position of wires 71 moved to the position above cooling plate 50 as shown in FIGS. 4 to 6 is a home position.

As shown in FIGS. 4 to 6, moving mechanism 73 includes a pair of guide rails 74 that are arranged on base 44 and extend in the Y-direction of casing 41, a first wire moving member 75 that is rigidly connected to wire supports 72, which are located on one (right) side of wafer W when viewed longitudinally from the side of transport opening 42, and is movable along guide rails 74, a second wire moving member 76 that is rigidly connected to wire supports 72, which are located one the opposite (left) side of wafer W when viewed longitudinally from the side of transport opening 42, and is movable along guide rails 74, and a drive unit 77 moving first and second wire moving members 75 and 76 along guide rails 74 in a unified manner. The driving of moving mechanism 73 is controlled according to instructions provided from a control unit to be described later.

Although not shown, each wire 71 is provided with, e.g., two bead members for defining a position of wafer W carried thereon. The bead members on wires 71 are located corresponding to four positions on the periphery of wafer W. Wafer W is located inside the bead members so that the bead members position wafer W at four positions of its periphery, and the position of wafer W on wires 71 does not shift even when wires 71 are moving.

Grooves 59 for accommodating wires 71 is formed at cooling plate 50 and are located at positions that are opposed to two wires 71, respectively, when transporting device 70 is in the above home position. Groove 59 has sizes that allow accommodation of wire 71 and the bead members formed thereon. Also, a raising mechanism 80 is arranged under cooling plate 50 and inside base 44 for raising cooling plate 50. Raising mechanism 80 is connected to, e.g., a plurality of support pins 81, can move support pins 81 vertically between positions above and below base 44 through holes formed in base 44.

Owing to raising mechanism 80, cooling plate 50 is configured to rise and lower with respect to wires 71. When cooling plate 50 rises relatively to wires 71 and grooves 59 accommodate wires 71, wafer W on wires 71 is transferred onto cooling plate 50. When wires 71 are relatively moved upward from grooves 59 at cooling plate 50, wafer W on cooling plate 50 is transferred onto wires 71. A structure that vertically moves wires 71 instead of vertically moving cooling plate 50 may be employed, and thereby cooling plate 50 is vertically moved with respect to wires 71.

Cooling plate 50 is provided at, e.g., four positions of its periphery with recesses 50a each directed to a center of cooling plate 50 as shown in FIGS. 4 and 6. As described later, recesses 50a are required when wafer W is transferred between cooling plate 50 and an external transporting mechanism such as first and second wafer transporting units 30A and 30B.

The position of wafer W held on wires 71 may be appropriately selected. In this example, wires 71 hold wafer W at the position near the position where the external transporting mechanism, e.g., second wafer transporting unit 30B holds wafer W. In the cooling plate 50, therefore, groove 59 corresponding to one of wires 71 extends through two recesses 50a near transport opening 42, and groove 59 corresponding to another wire 71 extends through two recesses 50a remote from transport opening 42.

Heating chamber 60 is configured to perform the heat treatment on wafer W inside it, and has an inner space larger than wafer W. Heating chamber 60 has a wall of, e.g., 3 mm in thickness made of a thermally conductive material such as aluminum alloy or stainless steel, and has a substantially U-shaped longitudinal section. Heating chamber 60 has side walls 62 located on the opposite sides of opening 61, respectively, and each side wall 62 has a space or slot 63, e.g., of about 3 mm for entering wire 71 thereinto. Opening 61 has a vertical size of 6 mm or less, and a flat space is formed inside it.

Heating plates 64 made of, e.g., aluminum nitride (AlN) or silicon carbide (SiC) are arranged on the upper and lower sides of heating chamber 60, respectively. Each heating plate 64 is a circular plate having substantially the same sizes as wafer W. Heating plate 64 is configured to heat the inner space of heating chamber 60.

In base 44, a gas outlet unit 65 is formed upstream of heating chamber 60, and an exhaust unit 66 is located at a deep or downstream position inside heating chamber 60. FIG. 4 does not show gas outlet unit 65 and exhaust unit 66. When wafer W is in heating chamber 60, gas outlet unit 65 and exhaust unit 66 are located in upstream and downstream positions with respect to wafer W, respectively, and thereby cover the diameter (width) of wafer W so that these are located to form a gas flow that can be considered as a substantially unidirectional flow flowing from one side of wafer W toward the opposite side.

Gas outlet unit 65 has an inclined surface portion directed toward opening 61 of heating chamber 60 in casing 41, and is provided at this inclined surface portion with, e.g., a large number of small holes that serve as outlets 65a and are equally spaced from each other in a widthwise direction (X-direction in the figure) of casing 41. A length between outlets 65a on the opposite ends is determined to cover the diameter of wafer W placed in heating chamber 60. Gas outlet unit 65 is connected via a gas supply pipe 65b and an open/close value V2 to a gas supply source 68 that is arranged, e.g., outside casing 41 for storing a clean purge gas such as a nitrogen gas or another inert gas.

Inside gas outlet unit 65, there is arranged a heat transfer plate (not shown) extending widthwise. A plurality of heat pipes 67 that are spaced widthwise from each other are connected at their ends on one side to the heat transfer plate. The other end of each heat pipe 67 is connected to heating plate 64. The purge-gas supplied from gas supply source 68 through gas supply pipe 65b into the inner space of gas outlet unit 65 is controlled by the heat transfer plate to attain a temperature equal to a heating temperature of wafer W (i.e., the surface temperature of heated wafer W). A heater arranged near an outlet of gas supply pipe 65b may be used for heating the purge gas.

Wafer W is supported in heating chamber 60 by wires 71 holding it, and is not in direct contact with heating plate 64. However, heating plates 64 heat wafer W from the upper and lower sides through heating chamber 60 formed of the thermally conductive material, and the heated purge gas flows along the surface of wafer W so that wafer W can be heated at a preset process temperature.

Exhaust unit 66 is opposed to gas outlet unit 65 with heating plate 64 under heating chamber 60 interposed therebetween, and has an inclined surface portion directed from a bottom plate 60b of heating chamber 60 toward the inside of heating chamber 60. This inclined surface portion is provided with, e.g., a large number of small holes that serve as exhaust holes 66a, and are equally spaced from each other in the widthwise direction of heating chamber 60. A length between exhaust holes 66a on the opposite ends is determined, e.g., to cover the diameter of wafer W. Exhaust unit 66 is connected to an exhaust pipe 66b, which extends externally from casing 41, and is connected, e.g., to an exhaust passage of a factory. A fan 66c is arranged in exhaust pipe 66b. The rotation speed of fan 66c is controlled so that exhaust unit 66 can discharge a gas from heating chamber 60 through exhaust holes 66a, e.g., at a preset exhaust rate. An open/close valve V3 is arranged in exhaust pipe 66b.

Gas outlet unit 65 and exhaust unit 66 are merely required to form the foregoing unidirectional flow, and the structures thereof are not restricted to those in this embodiment. Outlet 65a and exhaust hole 66a may have other forms and, for example, may have slit-like form that extends widthwise.

The foregoing control unit has a program storing unit, which is formed of, e.g., a computer and stores programs formed of, e.g., software incorporating instructions for executing operations of the heat treatment device such as processing, transferring and heating of wafer W as well as control of gas flows. The control unit reads the programs, and thereby controls the operations of the semiconductor manufacturing apparatus. The program storing unit stores the programs, e.g., by storing the program on a storage medium such as a hard disk, a compact disk or a magneto-optical disk.

Figure 11A:
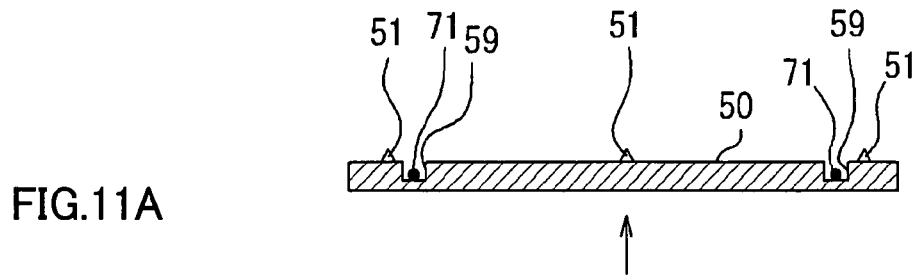
FIGS. 11A-11D are schematic cross sections showing an operation of transferring a wafer to the cooling plate in the first embodiment.
Figure 11B:
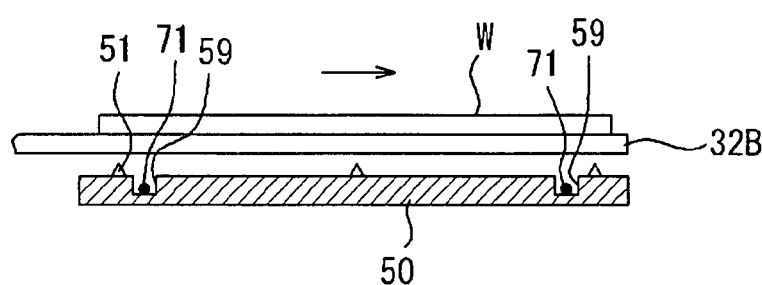
Figure 11C:
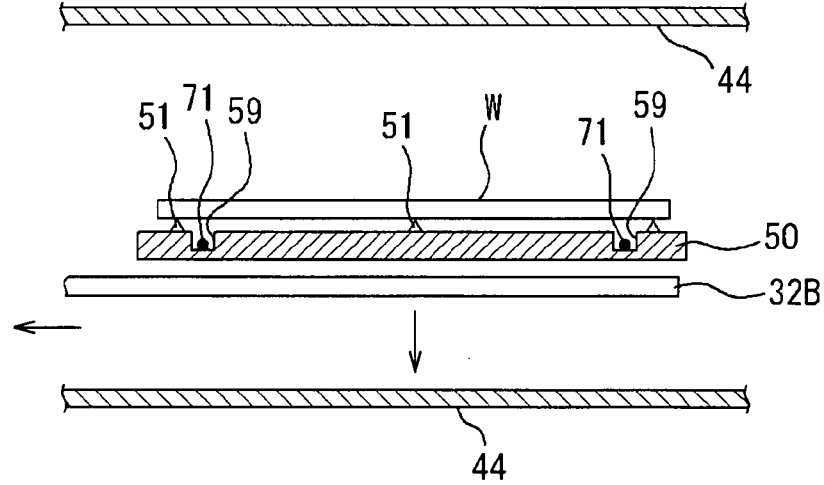
Figure 11D:
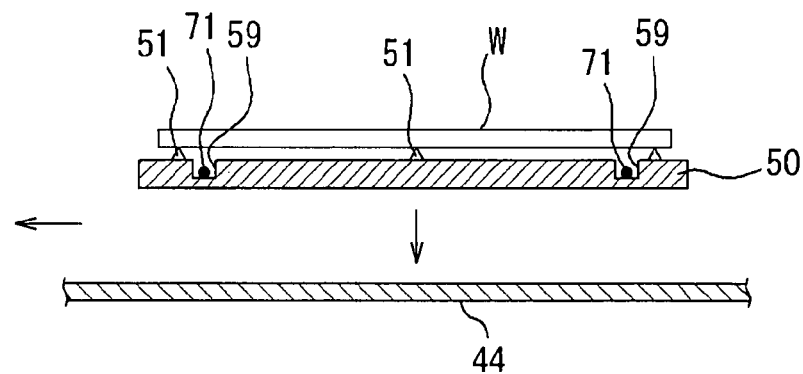
Figure 12A:
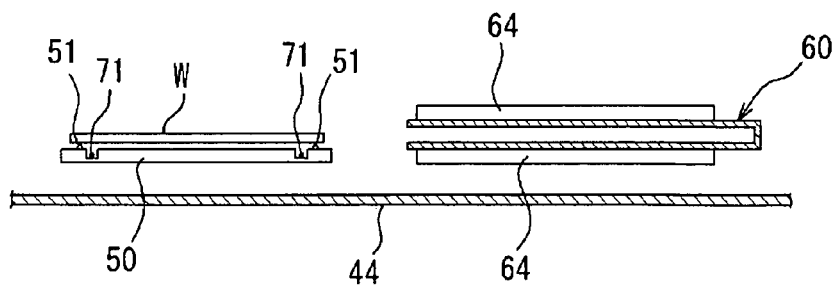
FIGS. 12A-12C are schematic cross sections showing an operation of transporting the wafer into the heating chamber in the heat treatment device of the first embodiment.

Operations of heat treatment device 40 will now be described. First, arm 32B of second wafer transporting unit 30B that is an external transporting mechanism transports exposed wafer W into casing 41 through transport opening 42, and transfers wafer W through cooling plate 50 onto wires 71. Thus, as shown in FIG. 11A, transporting device 70 is first located in the foregoing home position, and cooling plate 50 rises to form a passage for arm 32B of external second wafer transporting unit 30B between the lower surface of cooling plate 50 and base 44. Then, as shown in FIGS. 11B and 11C, arm 322B holding wafer W moves to a position above cooling plate 50, and then lowers so that it transfers wafer W onto cooling plate 50. Subsequently, arm 32B retreats from the position between the lower surface of cooling plate 50 and base 44. Thereafter, as shown in FIGS. 11D and 12A, cooling plate 50 carrying wafer W lowers to transfer it onto wires 71. In this operation, wafer W is located so that its periphery is located inside the bead members (not shown) arranged on wires 71. In this manner, wafer W is holed on wires 71 while being positioned by the bead members.

Figure 12B:
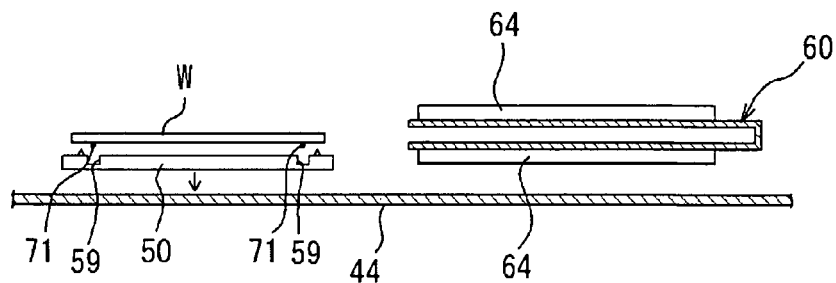
Figure 12C:
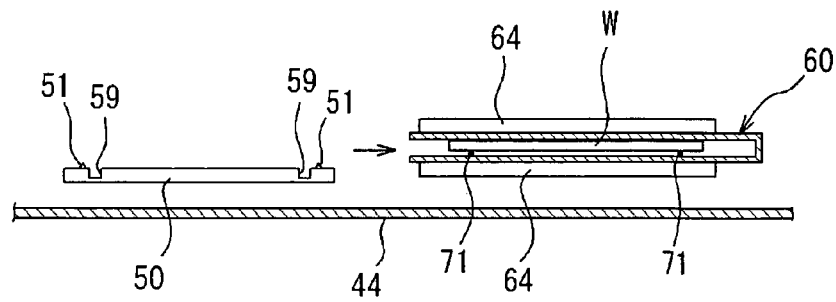

Then, as shown in FIGS. 12B and 12C, cooling plate 50 further lowers, and then wires 71 holding wafer W move toward heating chamber 60 to transport wafer W into heating chamber 60. The inner space of heating chamber 60 is already heated by heating plates 64, e.g., to about 120 degrees C. before wires 71 transport wafer W into heating chamber 60.

When wafer W held by wires 71 is transported into heating chamber 60, open/close value V2 opens to supply the purge gas from gas supply source 68 into gas supply pipe 65b. This purge gas is heated to about 120 degrees C. in outlet unit 65, and is discharged from outlets 65a toward a top plate 60a of heating chamber 60. At substantially the same time as the start of discharging of the purge gas from outlets 65a, open/close valve V3 opens and fan 66c rotates to exhaust the gas by exhaust unit 66. In this manner, the purge gas supplied from outlet unit 65 flows downstream through a space between top and bottom plates 60a and 60b of heating chamber 60, further flows through a space around wafer W into exhaust unit 66 and then flows outward from heating chamber 60 and casing 41. Thus, a unidirectional flow is formed around wafer W. The heat of heating plates 64 and the unidirectional flow induces an acid catalysis reaction of a chemically amplified resist applied over wafer W. After the purge gas is supplied to wafer W for a predetermined time, gas supply source 68 stops the supply of the purge gas, and exhaust unit 66 stops the exhausting operation.

Wires 71 transport wafer W to the foregoing home position, and then cooling plate 50 rises to bring projections 51 on cooling plate 50 into contact with the rear surface of wafer W. At the same time, vacuum pump 55 is driven to draw the air from the space between cooling plate 50 and the rear surface of wafer W through suction holes 52 near respective projections 51 so that wafer W is pushed onto projections 51. Thereby, the warp of wafer W is suppressed, and wafer W is cooled by cooling water (coolant) flowing through cooling pipe 58 arranged at cooling plate 50 while keeping a space, e.g., of about 0.1 mm between the upper surface of cooling plate 50 and the lower surface of wafer W so that rough cooling of wafer W is performed. More specifically, wafer W subjected to the heat treatment, e.g., at 120 degrees C. in heating chamber 60 is cooled to a temperature, e.g., of about 50 degrees C. at which the foregoing acid catalysis reaction becomes stable. After the rough cooling ends, wafer W is transferred through cooling plate 50 to arm 32A of first wafer transporting unit 30A, i.e., the external transporting mechanism, and is transported to the outside of casing 41.

The transfer of wafer W from cooling plate 50 to arm 32A is performed in the manner opposite to that in which wafer W is transferred from arm 32B of second wafer transporting unit 30B to cooling plate 50. For example, arm 32A of first wafer transporting unit 30A enters a space between base 44 and the lower surface of cooling plate 50 holding wafer W, and then rises to a position above cooling plate 50. Thereby, arm 32A receives wafer W from cooling plate 50, and then arm 32A holding wafer W is retreated from the position above cooling plate 50.

In heat treatment device 40 described above, the heat treatment is performed by transporting wafer W into heating chamber 60 having a flat space while holding wafer W on wires 71, and a vertically movable lid is not arranged in heating chamber 60. Also, wafer W is not transferred onto heating plate 64, and the heat treatment is performed while isolating wafer W from the heating plate. Therefore, the operation of transferring wafer W to and from heating plate 64 is not required.

Therefore, no time is required for vertically moving the lid and for transferring wafer W to and from the heating plate so that the overhead time can be reduced, and the throughput can be improved.

In this example, since heating plates 64 are arranged on the upper and lower sides of heating chamber 60, respectively, wafer W in heating chamber 60 can be heated from the upper and lower sides of heating chamber 60. Further, heating chamber 60 is flat, and a distance from wafer W to each heating plate 64 is small. Therefore, the temperature of wafer W rises quickly, and the time required for heating wafer W to a predetermined temperature can be short so that the overhead time can be reduced.

Further, the heat treatment is performed while keeping such a state that wafer W is held on wires 71, is not transferred onto heating plate 64 and is floating above heating plate 64. Therefore, even when wafer W warps, it is not necessary to lay warped wafer W on heating plate 64, and there is no possibility that a failure in transportation of wafer W occurs due to the warp of wafer W so that the heat treatment can be performed stably.

Further, the operations of transferring wafer W to and from heating plate 64 are not necessary. Therefore, an inner vertical size of heating chamber 60 is not required to include a clearance for such transferring operation. Heating chamber 60 is merely required to having an inner height allowing entry of wires 71 holding wafer W. Therefore, the inner space of heating chamber 60 can have a flat form, and the space of opening 61 can be small.

In heat treatment device 40 described above, heating chamber 60 is not provided with a vertically movable lid. Therefore, there is, no possibility that a gas turbulence occurs in the heating device due to the vertical movement of the lid. As described above, the gas turbulence is suppressed in the heating device, and the gas flow can be controlled in an appropriate manner. Thereby, in the heating device forming the unidirectional flow as described above, the unidirectional flow can be formed while suppressing the gas turbulence so that the gas flow disperses sublimates and discharges them from the exhaust holes. Although opening 61 of heating chamber 60 is always open, it has a small vertical size of 6 mm or less, and forms a thin space so that the gas turbulence can be suppressed, and the predetermined gas flow can be formed.

Since transporting device 70 does not transport wafer W to and from heating plate 64, this feature can likewise prevent the gas turbulence in heating chamber 60. If the transfer of wafer W between the transporting device and the heating plate were performed by a series of operations such as a vertical movement of the support pins, these operations would cause gas turbulence. However, such transfer operations are not performed, which can prevent the gas turbulence.

Since it is not necessary to employ drive mechanisms for vertically moving the lid and transferring wafer W to and from the heating plate, the drive system can be reduced, the control thereof can be easy and the required space can be reduced, as compared with the cases where the lid is vertically moved and/or wafer W is transferred to and from the heating plate. Further, cooling plate 50 is provided with recesses 50a that are substantially complementary in shape to external transporting arms 32A and 32B. External transporting arms 32A and 32B carrying wafer W thereon move to a position above cooling plate 50, and then move from the upper side of the cooling plate to the lower side thereof to transfer wafer W onto cooling plate 50. Therefore, the drive systems can be further reduced and the required space can be reduced, as compared with the case in which the vertically movable support pins are arranged for transferring wafer W between the external transporting mechanism (first and second wafer transporting units 30A and 30B) and cooling plate 50.

Second Embodiment

The first embodiment has been described in connection with the case where the coolant passage is formed by zigzag cooling pipe 58 arranged at cooling plate 50. However, cooling pipe 58 may be replaced with a flexible coolant-containing bag 90 forming a coolant passage as shown in FIGS. 9A-9C and FIGS. 10A-10C. This coolant-containing bag 90 may be made of, e.g., aluminum alloy similarly to cooling plate 50 of the first embodiment, and may be layered over a cooling plate body 500 of a substantially circular plate-like form having substantially the same diameter as wafer W to form a cooling plate 50A. In this case, coolant-containing bag 90 is provided with a plurality of (e.g., nine) suction holes 52 located, e.g., at the center of cooling plate 50A and circumferentially equally spaced eight positions on the same circle. Also, each suction hole 52 is connected to vacuum pump 55. Thereby, the negative pressure produced by vacuum pump 55 can act on a portion near each suction hole 52 to press wafer W onto the surface of coolant-containing bag 90.

Figure 10A:
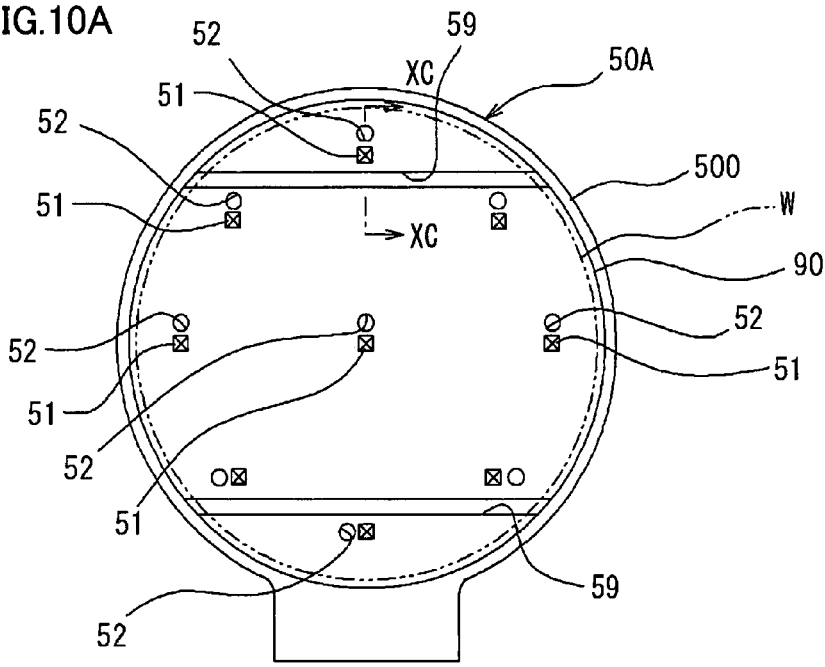
FIGS. 10A-10C are a schematic plan (FIG. 10A) of a cooling plate in a third embodiment of the heat treatment device according to the invention, a side view (FIG. 10B) thereof and an enlarged cross section (FIG. 10C) taken along line XC-XC in FIG. 10A.
Figure 10B:
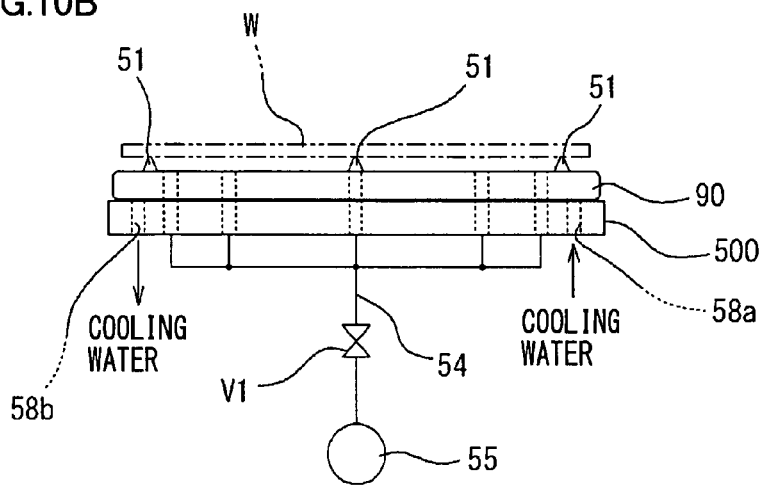
Figure 10C:
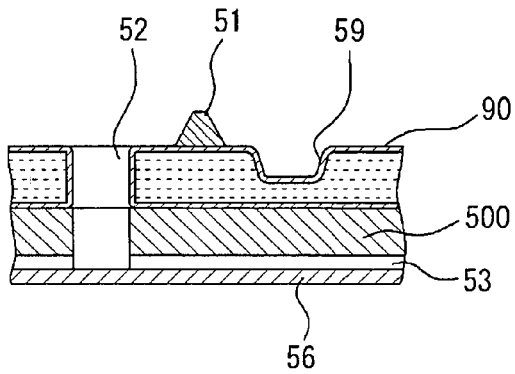

As shown in FIGS. 10A-10C, the following structure may be employed in the above case. Projections 51 made of, e.g., synthetic resin or ceramic are located at the center of cooling plate 50A and the circumferentially equally spaced eight positions on the same circle, respectively, and are adhered to the surface of coolant-containing bag 90 so that wafer W may be laid on the surface of coolant-containing bag 90 with a space therebetween. Also, suction hole 52 is formed near each projection 51, and is connected to vacuum pump 55. Thereby, the negative pressure produced by vacuum pump 55 acts on the portion near each suction hole 52 to press wafer W onto each projection 51.

Coolant-containing bag 90 is provided at its surface with two grooves 59 into which wires 71 can move, respectively. Suction holes 52 extend through cooling plate body 500, and the ends thereof on the rear surface of cooling plate body 500 are connected together by suction groove 53. Closing member 56 closes the opening of suction groove 53 (see FIGS. 10A-10C).

Coolant-containing bag 90 is made of a water-resistant and flexible material such as a polytetrafluorethylene (i.e., Teflon (R)). Coolant-containing bag 90 has a thickness of about 2 mm, and is layered over cooling plate body 500 of about 2 mm in thickness to form cooling plate 50A of about 4 mm in thickness.

Other structures in the second embodiment are the same as those in FIG. 1, and therefore description thereof is not repeated.

According to a heat treatment device 40A having the above structure, the negative pressure produced by vacuum pump 55 acts on the portion near each suction hole 52 to press wafer W onto the surface of elastically deformable coolant-containing bag 90, or to press wafer W onto projections 51. Thereby, wafer W can be drawn and held so that the warp of wafer W can be suppressed, and wafer W can be cooled uniformly.

Third Embodiment

Figure 13:
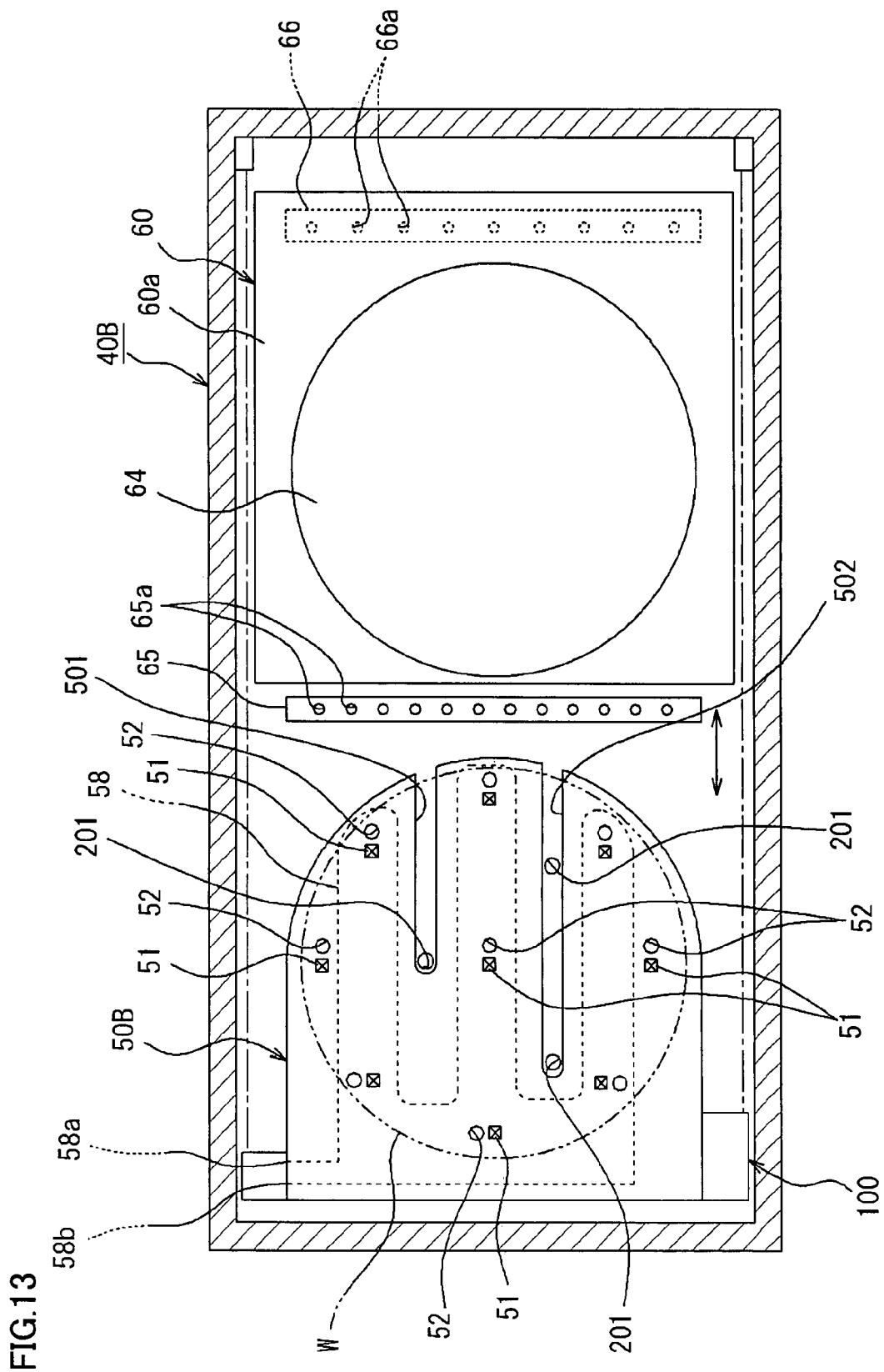
FIG. 13 is a schematic plan showing a fourth embodiment of the heat treatment device according to the invention.
Figure 14:
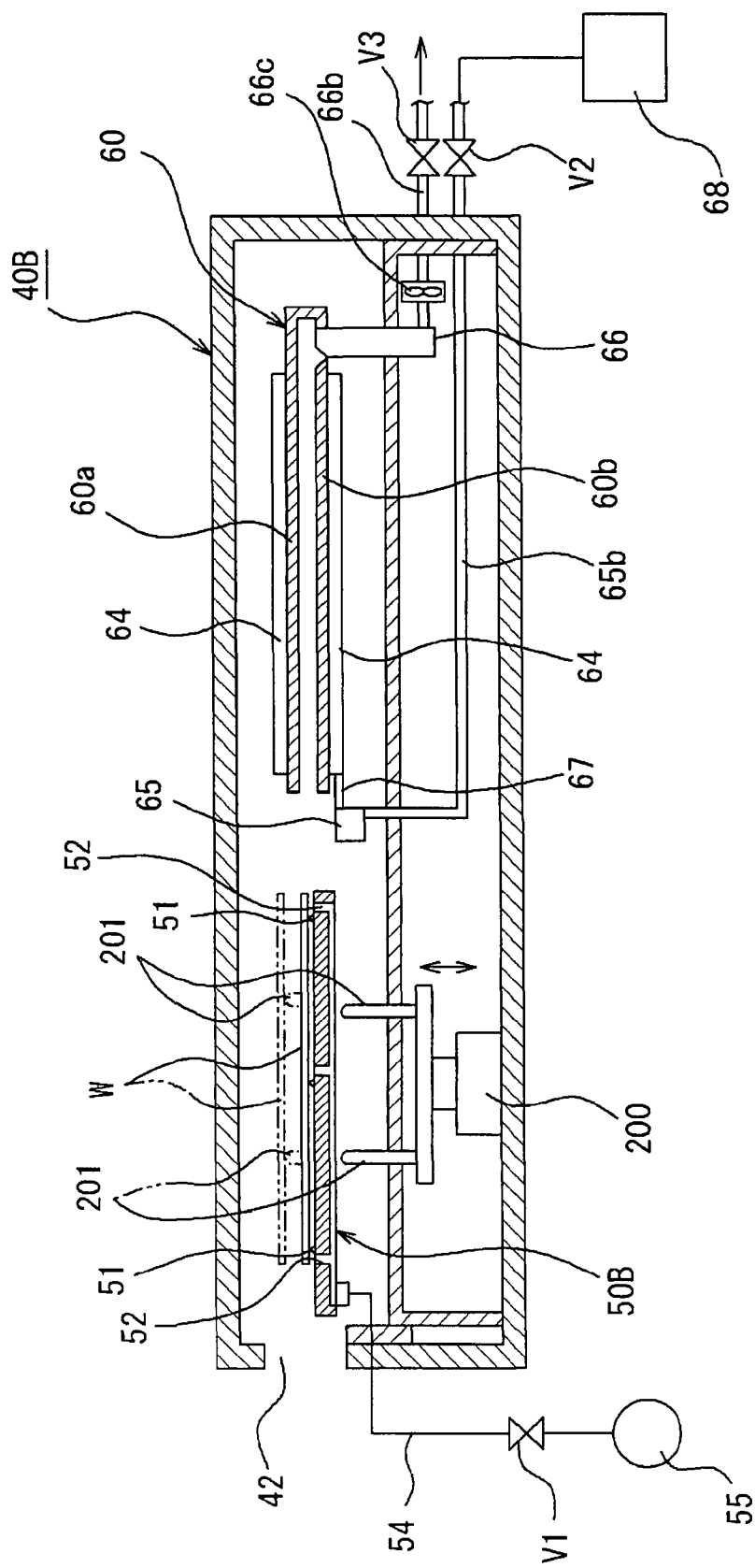
FIG. 14 is a schematic cross section showing the heat treatment device of the fourth embodiment.

FIG. 13 is a schematic plan showing a major portion of a third embodiment of the heat treatment device according to the invention, and FIG. 14 is a schematic cross section of the heat treatment device of the third embodiment.

A heat treatment device 40B of the third embodiment has a cooling plate 50B that is made of aluminum alloy similarly to the first embodiment and has a function of transferring wafer W. similarly to the first embodiment. As shown in FIG. 13, heat treatment device 40B includes a plate moving mechanism 100 that can move cooling plate 50B into and from heating chamber 60 and is formed of, e.g., a ball screw mechanism, a timing belt mechanism or the like. Heat treatment device 40B also includes insertion open grooves 501 and 502 for avoiding interface with vertically movable support pins 201 that transfer wafer W to and from cooling plate 50.

In this structure, cooling plate 50B includes two insertion open grooves 501 and 502 having different lengths for avoiding the interface with three support pins 201, which can be vertically moved by a raising mechanism 200, when cooling plate 50B retreated from heating chamber 60 is in the home position. Also, at the center and the circumferentially equally spaced positions (e.g., eight positions) on the same circle of cooling plate 50B, projections 51 are formed at the surface of cooling plate 50B for placing wafer W on the surface of cooling plate 50B with a slight space of, e.g., about 0.1 mm therebetween, similarly to the first embodiment. Suction holes 52 are arranged near respective projections 51. In this structure, suction holes 52 are communicated with each other through the suction groove (not shown) formed at the rear surface of cooling plate 50, and are connected to vacuum pump 55, i.e., the suction device through suction conduit 54 connected to the suction groove. The opening of the suction groove is closed by the closing member (not shown).

Cooling plate 50B is provided with cooling pipe 58 that is the coolant passage and extends without crossing two insertion open grooves 501 and 502 for uniformly cooling the whole wafer carrying area of cooling plate 50B. Cooling pipe 58 is provided at its one end with a cooling water supply port 58a connected to the cooling water supply source (not shown), and is also provided at the other end with outlet 58b of the cooling water.

Other structures of the third embodiment are the same as those of the first embodiment. The same portions bear the same reference numbers, and description thereof is not repeated.

The operations of heat treatment device 40B of the third embodiment will now be described with reference to FIGS. 17A-17D. Wafer W transferred into casing 41 of heat treatment device 40B by the external transporting mechanism (not shown) is located above cooling plate 50B in the home position, and the raising mechanism (not shown) raises support pins 201 to receive wafer W (see FIG. 17A). After receiving wafer W, support pins 201 lower to lay wafer W on projections 51 formed at the surface of cooling plate 50B (see FIG. 17B). In this operation, vacuum pump 55 draws the air from the space between cooling plate 50B and the rear surface of wafer W through suction holes 52 neighboring to the respective projections 51 so that wafer W is pressed onto projections 51. Thereby, the warp of wafer W is suppressed, and wafer W is drawn and held while keeping a space, e.g., of about 0.1 mm between the upper surface of cooling plate 50B and the lower surface of wafer W.

Figure 17A:
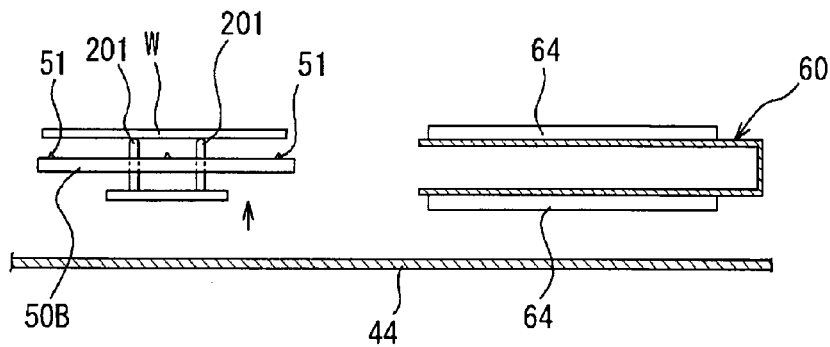
FIGS. 17A-17D are schematic cross sections showing heating and cooling operations performed on the wafer by the heat treatment device of the fourth embodiment.
Figure 17B:
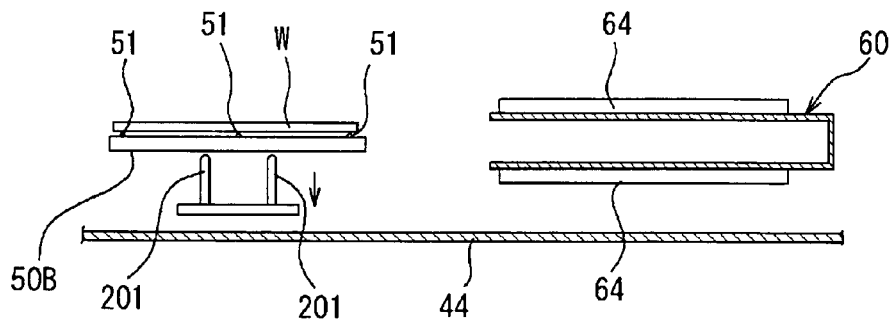
Figure 17C:
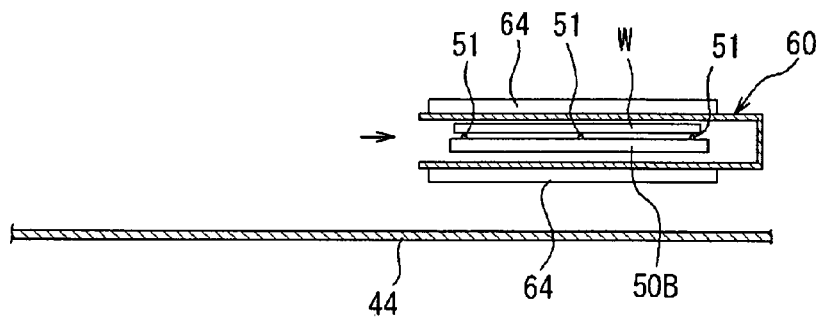
Figure 17D:
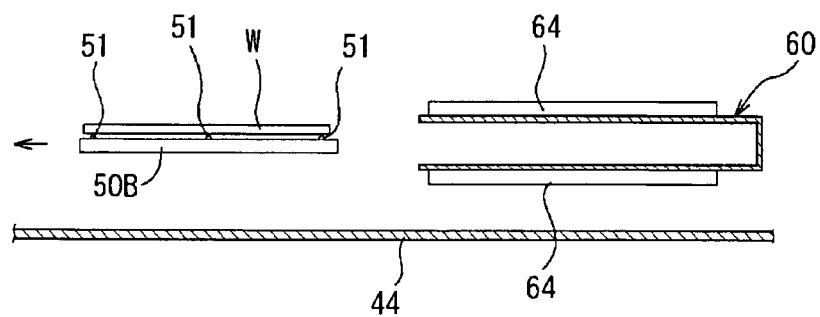

Then, plate moving mechanism 100 moves cooling plate 50B holding wafer W toward heating chamber 60, and wafer W is transported into heating chamber 60 and is subjected to the heat treatment (PEB) as shown in FIG. 17C. This induces an acid catalysis reaction of a chemically amplified resist applied over wafer W.

After the heat treatment (PEB) of wafer W is completed, the cooling water (coolant) is passed through cooling pipe 58 arranged at cooling plate 50B to cool wafer W. While wafer W is being roughly cooled, plate moving mechanism 100 operates to transport wafer W by cooling plate 50B to the foregoing home position. During this operation, vacuum pump 55 continues its operation to draw the air from the space between cooling plate 50 and the rear surface of wafer W through suction holes 52 neighboring to respective projections 51 so that wafer W is pressed onto projections 51. Thereby, the warp of wafer W that may be caused by the heat treatment (PEB) is suppressed, and the space, e.g., of about 0.1 mm is formed between the upper surface of cooling plate 50 and the lower surface of wafer W. While keeping this state, the cooling water (coolant) flowing through cooling pipe 58 arranged at cooling plate 50 cools wafer W to perform rough cooling on wafer W so that the above acid catalysis reaction stops. After the end of the rough cooling, wafer W is transferred through cooling plate 50 to arm 32A of first wafer transporting unit 30A that is the external transporting mechanism, and is transported externally from casing 41.

According to heat treatment device 40B of the third embodiment having the above structures, cooling plate 50B is transferred from heating chamber 60 to the home position after the heat treatment (PEB) while passing the cooling water through cooling pipe 58 of cooling plate 50B so that the cooling time can be reduced.

Fourth Embodiment

Figure 15A:
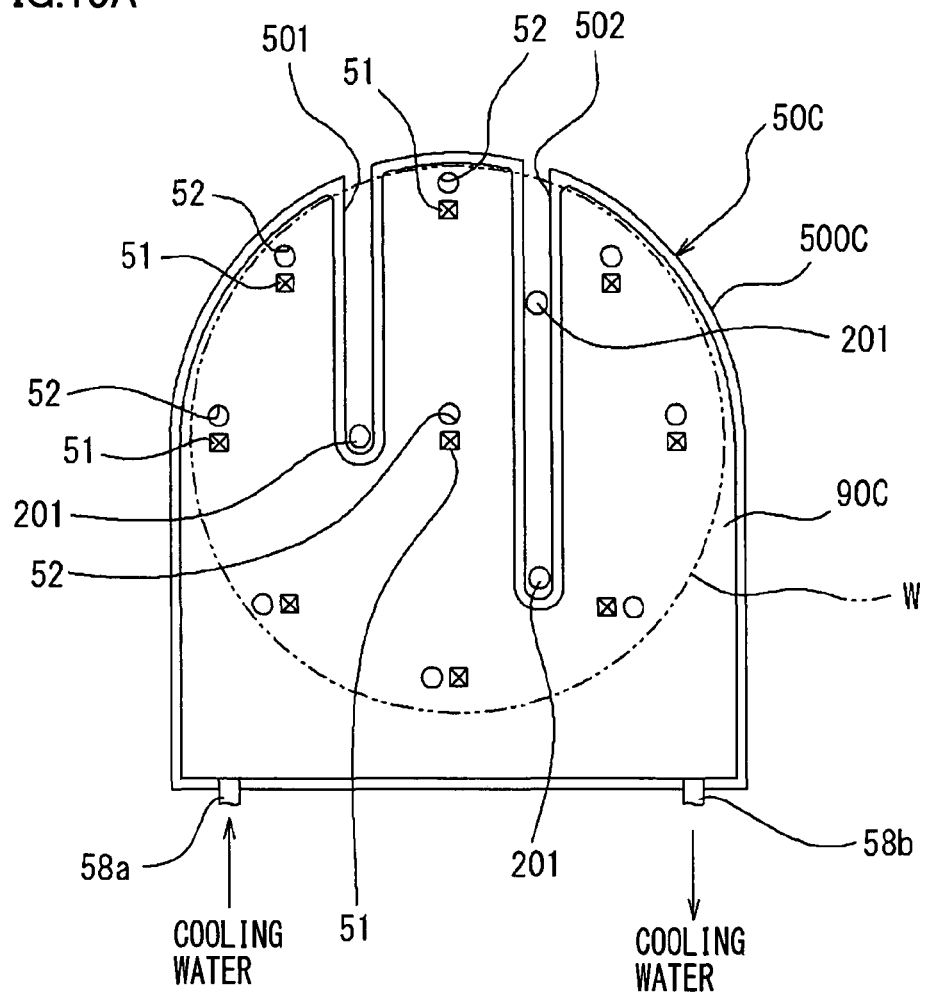
FIGS. 15A and 15B are a schematic plan (FIG. 15A) showing the cooling plate in the fourth embodiment and a side view (FIG. 15B) thereof
Figure 15B:
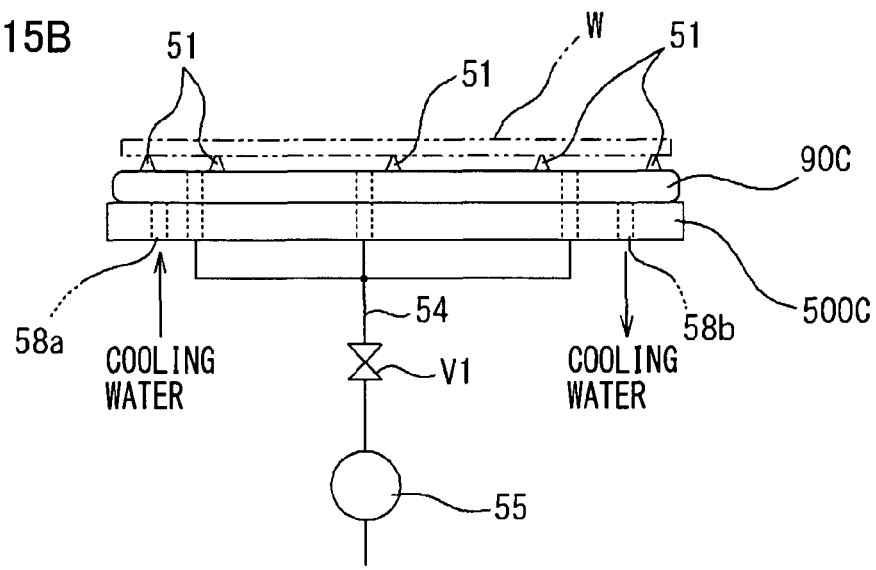

The third embodiment has been described in connection with the structure in which the coolant passage is formed by zigzag cooling pipe 58 arranged at cooling plate 50B. However, cooling pipe 58 may be replaced with a coolant-containing bag 90C that is flexible and forms a coolant passage as shown in FIGS. 15A and 15B, and a cooling plate 50C may be formed by layering this coolant-containing bag 90C on the surface of a cooling plate body 500C that is formed of, e.g., an aluminum alloy member similarly to cooling plate 50 of the first embodiment, and has a substantially circular plate-like form of a diameter substantially equal to that of wafer W. Coolant-containing bag 90C is made of substantially the same material such as a polytetrafluoroethylene (i.e., Teflon (R)) as that in the second embodiment. Coolant-containing bag 90C is layered over the whole area of cooling plate body 500C except for insertion open grooves 501 and 502 for support pins 201.

In this case, the following structure may be employed. Coolant-containing bag 90C is provided at a plurality of (e.g., nine) positions with projections 51 that are located at the center of cooling plate 50C and circumferentially equally spaced eight positions on the same circle, and wafer W is placed on the surface of coolant-containing bag 90C with a space therebetween. Also, suction holes 52 are arranged near respective projections 51, and are connected to vacuum pump 55 so that the negative pressure produced by vacuum pump 55 acts on the portion near each suction hole 52 to push wafer W onto projections 51 at the surface of coolant-containing bag 90C.

According to the above structure, the negative pressure produced by vacuum pump 55 acts on the portion near each suction hole 52 to push wafer W onto projections 51 at the surface of coolant-containing bag 90C, and wafer W is drawn and held while keeping a space, e.g., of about 0.1 mm above cooling plate 50C. Thereby, the warp of wafer W can be suppressed, and wafer W can be cooled uniformly.

Figure 16A:
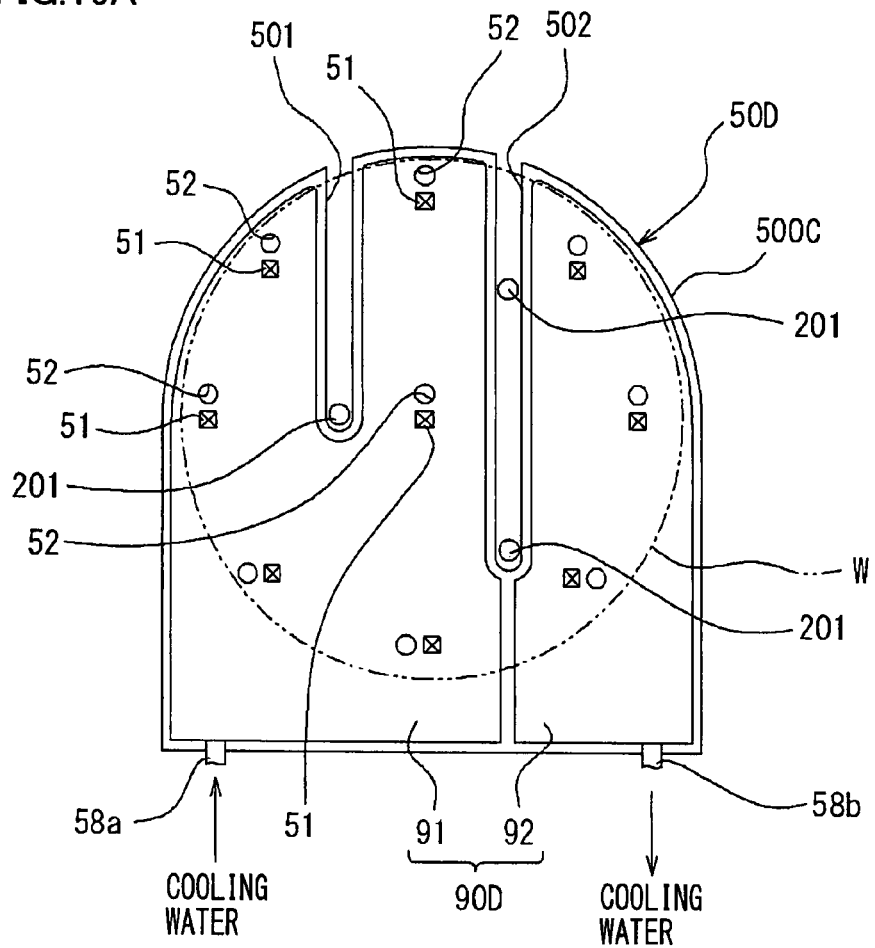
FIGS. 16A and 16B are a schematic plan (FIG. 16A) showing a modification of the cooling plate in the fourth embodiment and a side view (FIG. 16B) showing the same with a certain part cut away.
Figure 16B:
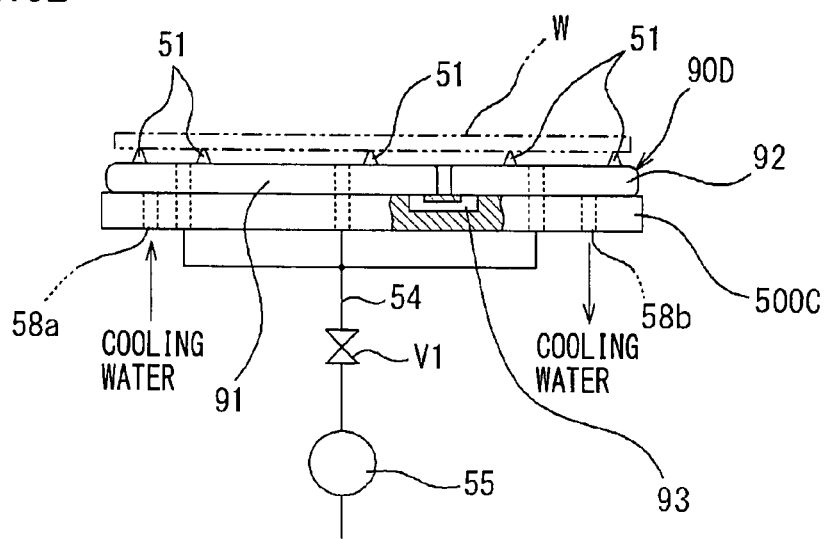

The description has been given on the structure in which one coolant-containing bag 90C is layered over the surface of cooling plate body 500C. However, as shown in FIGS. 16A and 16B, a coolant-containing bag 90D may be formed of a plurality of (e.g., two) divided bags 91 and 92, and coolant-containing bag 90D thus formed may be layered over the surface of cooling plate body 500C to form a cooling plate 50D. In this case, divided bags 91 and 92 are communicated with each other through a communication passage 93 formed at cooling plate body 500C (see FIG. 16B). Divided bag 91 has a contour avoiding insertion open groove 501 as well as half the other insertion open groove 502. The other divided bag 92 has a contour avoiding the other half of insertion open groove 502. Except for these structures, coolant-containing bag 90D has substantially the same structure as coolant-containing bag 90C of the fourth embodiment. The number of divided bags 91 and 92 is not restricted to two, and three or more divided bags may be employed provided that these are communicated with each other.

As described above, coolant-containing bag 90D is formed of divided bags 91 and 92 so that coolant-containing bag 90D can be easily layered on cooling plate body 500C having insertion open grooves 501 and 502.

Structures of the fourth embodiment other than the above are the same as those of the third embodiment. The same portions bear the same reference numbers, and description thereof is not repeated.

Then, the steps of processing wafer W by the foregoing application/development device will be described. The following description will be given on the case where a bottom anti-reflective coating (BARC) is formed over the surface of wafer W, a resist layer is formed over the bottom anti-reflective coating (BARC) and a top anti-reflective coating TC (which will be referred to as a "protective film TC" hereinafter) is layered over the surface of the resist film. When carrier 10 accommodating, e.g., twenty-five wafers W is placed on table 11, open/close unit 12 as well as the lid of carrier 10 are opened or removed, and transfer device A1 takes out wafer W. The transfer unit (not shown) forming one stage of shelf unit U1 transfers wafer W to main transporting device A2, and the pre-treatment for the application processing is performed, e.g., by unit (BCT) 23 so that the bottom anti-reflective coating (BARC) is formed over the surface of wafer W. Thereafter, main transporting device A2 transfers wafer W to the heat treatment unit of shelf unit U1, and the bake is performed thereon.

Thereafter, main transporting device A2' transports wafer W into coating unit (COT) 25, and the resist is applied to form a thin film over the whole surface of wafer W. Then, main transporting device A2 transports wafer W to the heat treatment unit of shelf unit U2, in which pre-bake (PAB) is performed.

Then, unit (TCT) 24 forms the protective film TC over the surface of the resist layer, and main transporting unit A2 transfers wafer W to the heat treatment unit of shelf unit U2, in which the bake is performed. After the bake, wafer W is transported to the periphery exposing device (WEE), and the periphery exposure processing is performed. Thereafter, the heat treatment and the cooling processing are performed on wafer W. Then, first and second wafer transporting units 30A and 30B of interface unit 3 transport wafer W to exposing unit 4, and the predetermined exposure processing is performed on wafer W.

Second wafer transporting unit 30B of interface unit 3 transports exposed wafer W to heating/cooling unit (PEB) 37, and the post-exposure bake processing is performed in heating chamber 60 of heating/cooling unit (PEB) 37. This promotes the acid catalysis reaction of the chemically amplified resist. Thus, the acid catalysis reaction of the acid that is generated by acid generating agent contained in the resist causes a chemical reaction of the resist component so that this reaction region becomes soluble with respect to the developer liquid when the resist is of a positive type.

Thereafter, cooling plates 50, 50A, 50B and 50C in heating/cooling unit (PEB) 37 control wafer W to attain a predetermined temperature. In this operation, wafer W is roughly cooled while suppressing the warp of wafer W, and the acid catalysis reaction stops within a short time.

Then, wafer W subjected to the heating and cooling processing is taken out by first wafer transporting unit 30A from heating/cooling unit (PEB) 37, and then is transferred to developing unit 26, and the developer liquid is applied to wafer W. Then, main arm A1 transports wafer W to the heat treatment unit (POST), and the predetermined development is performed thereon.

Wafer W subjected to the development is accommodated in an empty carrier 10 laid on table 11 of carrier station 1, and a series of the application and development processing ends.

The embodiment has been described in connection with the case where the heat treatment device according to the invention is applied to the heating/cooling unit (PEB) 37 in the application/development system. However, the heat treatment device according to the invention can be applied to heat treatment devices other than heating/cooling unit (PEB) 37, and can be naturally used for the heat treatment for LCD substrates, mask substrates and the like other than wafers W.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A heat treatment device comprising:
   a heating chamber having a heating plate heating a work substrate;
   a cooling plate cooling the work substrate heated by said heating plate; and
   a transporting device transporting the work substrate into and from said heating chamber,
   said cooling plate including
   a coolant passage,
   a plurality of projections defining a space between said work substrate laid on said cooling plate and a body surface of said cooling plate,
   suction holes arranged near said respective projections and communicated with a suction device,
   a suction groove formed on a rear surface side of said cooling plate for connecting said suction holes together, and
   a closing member which closes an opening of said suction groove.

2. The heat treatment device according to claim 1, wherein said cooling plate includes
   a plate moving mechanism moving said cooling plate toward and away from said heating chamber for operating said cooling plate also as said transporting device, and
   an open groove for inserting a vertically movable support pin transferring said work substrate with respect to said cooling plate.

3. The heat treatment device according to claim 2, wherein said the cooling plate includes
   an accommodation space formed in said suction groove located at a crossing position of said suction hole and said coolant passage for accommodating a pipe forming said coolant passage, and
   the closing member closes openings of said suction groove and said accommodation space.

4. The heat treatment device according to claim 1, wherein said the cooling plate includes
   an accommodation space formed in said suction groove located at a crossing position of said suction hole and said coolant passage for accommodating a pipe forming said coolant passage, and
   the closing member closes openings of said suction groove and said accommodation space.

5. The heat treatment device according to claim 1, wherein said transporting device includes
   a plurality of wires extending across a transport passage connecting said heating chamber to said cooling plate, and transporting the work substrate laid on said wires, and
   a wire moving mechanism moving said wires to transport said work substrate between a position above said cooling plate and a position in said heating chamber, and
   said cooling plate includes
   a groove formed at the surface of said cooling plate and allowing said wires to move into said groove, and
   a raising mechanism for raising and lowering said cooling plate relatively to said wires for transferring said work substrate to and from said wires.

6. The heat treatment device according to claim 5, wherein said the cooling plate includes
   an accommodation space formed in said suction groove located at a crossing position of said suction hole and said coolant passage for accommodating a pipe forming said coolant passage, and
   the closing member closes openings of said suction groove and said accommodation space.

7. A heat treatment device comprising:
   a heating chamber having a heating plate heating a work substrate;
   a cooling plate cooling the work substrate heated by said heating plate; and
   a transporting device transporting the work substrate into and from said heating chamber,
   said cooling plate including
   a coolant passage formed of a flexible coolant-containing bag layered over a body surface of said cooling plate, and
   a plurality of suction holes communicated with a suction device.

8. The heat treatment device according to claim 7, wherein said transporting device includes
   a plurality of wires extending across a transport passage connecting said heating chamber to said cooling plate, and transporting the work substrate laid on said wires, and
   a wire moving mechanism moving said wires to transport said work substrate between a position above said cooling plate and a position in said heating chamber, and
   said cooling plate includes
   a groove formed at the surface of the coolant-containing bag and allowing said wires to move into said groove, and
   a raising mechanism for raising and lowering said cooling plate relatively to said wires for transferring said work substrate.

9. The heat treatment device according to claim 8, wherein said the coolant-containing bag is formed of a plurality of divided bags communicated with each other via a communication passage.

10. The heat treatment device according to claim 7, wherein
said cooling plate includes
a plate moving mechanism moving said cooling plate toward and away from said heating chamber for operating said cooling plate also as the transporting device, and
an open groove for inserting a vertically movable support pin transferring said work substrate to and from said cooling plate.

11. The heat treatment device according to claim 10, wherein
said the coolant-containing bag is formed of a plurality of divided bags communicated with each other via a communication passage.

12. The heat treatment device according to claim 7, wherein
said the coolant-containing bag is formed of a plurality of divided bags communicated with each other via a communication passage.

13. A heat treatment device comprising:
a heating chamber having a heating plate heating a work substrate;
a cooling plate cooling the work substrate heated by said heating plate; and
a transporting device transporting the work substrate into and from said heating chamber,
said cooling plate including
a coolant passage formed of a flexible coolant-containing bag layered over a body surface of said cooling plate,
a plurality of projections defining a space between said work substrate laid on said coolant-containing bag and a surface of said coolant-containing bag, and
suction holes arranged near said respective projections and communicated with a suction device.

14. The heat treatment device according to claim 13, wherein
said transporting device includes
a plurality of wires extending across a transport passage connecting said heating chamber to said cooling plate, and transporting the work substrate laid on said wires, and
a wire moving mechanism moving said wires to transport said work substrate between a position above said cooling plate and a position in said heating chamber, and
said cooling plate includes
a groove formed at the surface of the coolant-containing bag and allowing said wires to move into said groove, and
a raising mechanism for raising and lowering said cooling plate relatively to said wires for transferring said work substrate.

15. The heat treatment device according to claim 14, wherein
said the coolant-containing bag is formed of a plurality of divided bags communicated with each other via a communication passage.

16. The heat treatment device according to claim 15, wherein
said cooling plate includes
a plate moving mechanism moving said cooling plate toward and away from said heating chamber for operating said cooling plate also as the transporting device, and
an open groove for inserting a vertically movable support pin transferring said work substrate to and from said cooling plate.

17. The heat treatment device according to claim 16, wherein
said the coolant-containing bag is formed of a plurality of divided bags communicated with each other via a communication passage.

18. The heat treatment device according to claim 13, wherein
said the coolant-containing bag is formed of a plurality of divided bags communicated with each other via a communication passage.

* * * * *